United States Patent [19]
Abato et al.

[11] Patent Number: 5,508,937
[45] Date of Patent: Apr. 16, 1996

[54] INCREMENTAL TIMING ANALYSIS

[75] Inventors: Richard P. Abato, Underhill, Vt.; Anthony D. Drumm, Rochester, Minn.; David J. Hathaway, Underhill Center, Vt.; Lukas P. P. P. van Ginneken, Baldwin Place, N.Y.

[73] Assignee: International Business Machines Corporation, Armonk, N.Y.

[21] Appl. No.: 49,699

[22] Filed: Apr. 16, 1993

[51] Int. Cl.⁶ .................................................. G06F 17/50
[52] U.S. Cl. .......................................... 364/488; 364/578
[58] Field of Search ........................... 364/488, 489, 364/490, 578; 395/500

[56] References Cited

U.S. PATENT DOCUMENTS

| | | | |
|---|---|---|---|
| 4,263,651 | 4/1981 | Donath et al. | 364/300 |
| 4,744,084 | 5/1988 | Beck et al. | 371/23 |
| 4,827,427 | 5/1989 | Hyduke | 364/489 |
| 4,827,428 | 5/1989 | Dunlop et al. | 364/491 |
| 4,882,690 | 11/1989 | Shinsha et al. | 364/490 |
| 4,907,180 | 3/1990 | Smith | 364/578 |
| 4,924,430 | 5/1990 | Zasio et al. | 364/578 |
| 4,937,827 | 6/1990 | Beck et al. | 371/23 |
| 5,003,487 | 3/1991 | Drumm et al. | 364/489 |
| 5,010,493 | 4/1991 | Matsumoto et al. | 364/490 |
| 5,068,812 | 11/1991 | Schaefer et al. | 364/578 |
| 5,095,454 | 3/1992 | Huang | 364/578 |
| 5,111,413 | 5/1992 | Lazansky et al. | 364/578 |
| 5,168,455 | 12/1992 | Hooper | 364/490 |
| 5,210,700 | 5/1993 | Tom | 364/489 |
| 5,231,590 | 7/1993 | Kumar et al. | 364/491 |
| 5,262,959 | 11/1993 | Chkoreff | 364/489 |
| 5,301,318 | 4/1994 | Mittal | 395/600 |
| 5,333,032 | 7/1994 | Matsumoto et al. | 364/489 |

OTHER PUBLICATIONS

Hitchcock, Robert B., Sr., "Timing Verification and the Timing Analysis Program", IEEE, paper 34.2, pp. 594–604, 1982.

"Timing Analysis for nMOS VLSI" by Norman P. Jouppi, IEEE 20th Design Automation Conference, 1983, pp. 411–418.

"Timing Influenced Layout Design" by Michael Burstein et al., IEEE 22nd Design Automation Conference, 1985, pp. 124–130.

Primary Examiner—Vincent N. Trans
Attorney, Agent, or Firm—Heslin & Rothenberg

[57] ABSTRACT

Incremental timing analyzer for selectively performing timing analysis on a revised electronic circuit design resulting from one or more modifications to an initial electronic circuit design having input nodes, output nodes, and active elements electrically connected therebetween in a set of signal paths interconnected by a plurality of nodes. Each signal path has a timing delay associated therewith. Data is recorded representative of the modification's affect on relative timing values for a set of signals propagated through the circuit design. The recorded data includes a leftmost frontier of change in relative timing values and a rightmost frontier of change in relative timing values. Upon presentation of a specific timing analysis request, incremental timing analysis on the selected portion of the modified electronic circuit design is conducted employing the recorded frontiers of change to limit the timing value analysis. The concepts presented may be used for incremental recalculation of any signal value propagated forward or backward through a logic network.

32 Claims, 12 Drawing Sheets

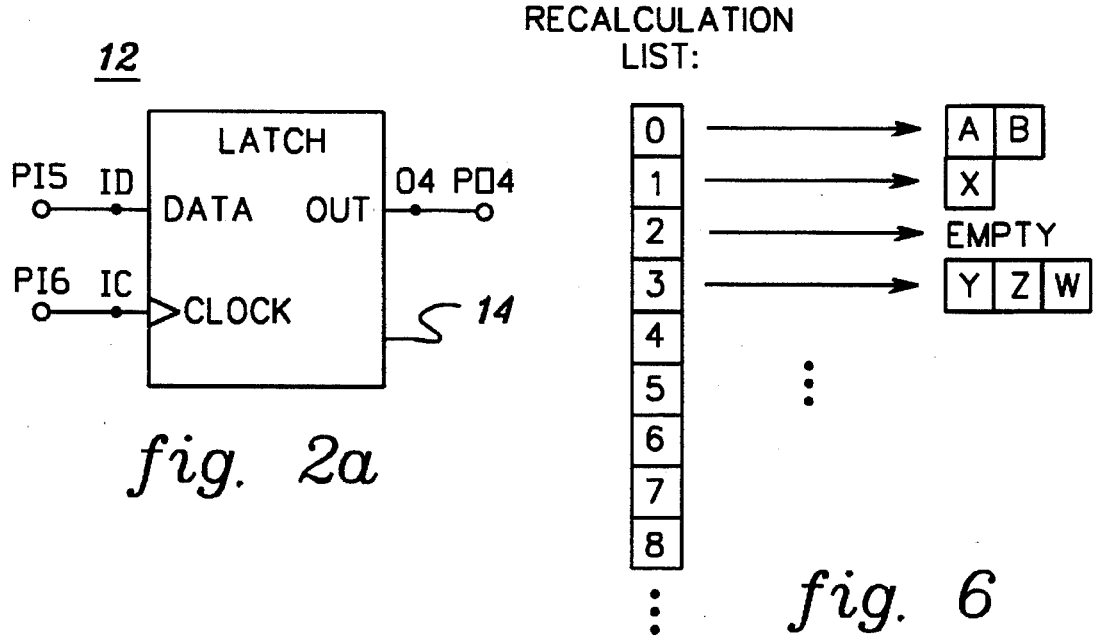
fig. 2a
fig. 6
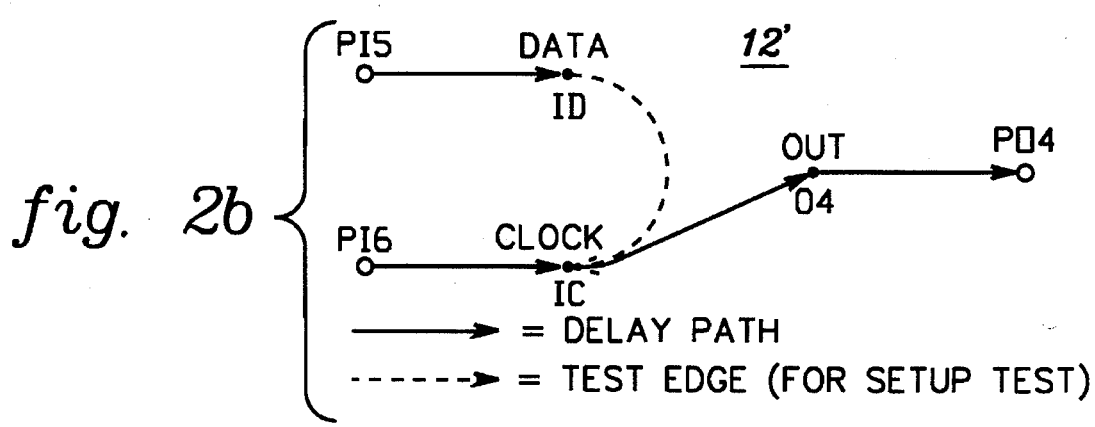
fig. 2b
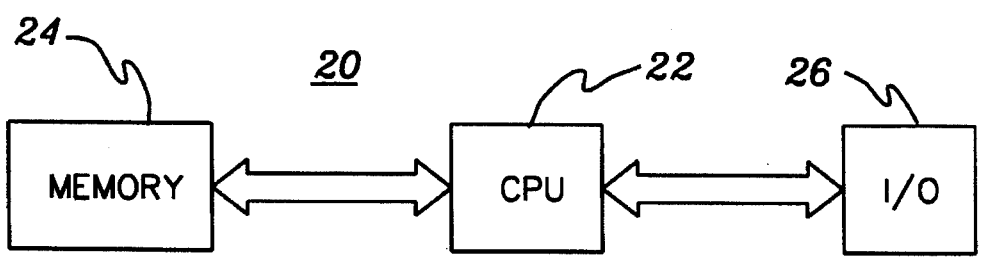
fig. 3

GetArrival (X) LATE MODE PROCESS

INCREMENTAL TIMING ANALYSIS

TECHNICAL FIELD

This invention relates generally to design of complex circuit networks, and more particularly, to selective, incremental recalculation of a signal value (such as a timing signal) propagated forward or backward through such a network in response to one or more incremental modifications to the complex circuit network under design.

BACKGROUND ART

The use of computer simulation for designing and verifying the logical operation of an electronic circuit design is well known. In the design of complex high-speed circuit networks, simulation analysis is required both to determine whether a performance objective is achieved, and to guide processes which attempt to meet that objective. Various techniques exist for finding the performance of part or all of a circuit network. However, these techniques generally must begin from scratch whenever any modification to the network design is made which might affect performance. Since many such modifications and adjustments are typically made to a design, and since the time required to compute the performance of even a small portion of a circuit network can be significant, a designer is typically forced to update design analysis at infrequent intervals. This means that many design decisions are made, either by the designer or by an automatic design optimization program, based on old information (such as changes to correct performance problems which may have already been corrected).

By way of specific example, the field of non-incremental static timing analysis is well developed. Existing methods generally start with arrival times at primary inputs, and propagate these arrival times through the logic network, adding the delays of the circuits and wires traversed during this propagation, to obtain arrival times at different points (or nodes) in the logic network. In a similar manner, required arrival times (i.e., required times) at primary outputs of the design are propagated backward through the logic network, subtracting the delays of the circuits and wires traversed during the propagation, to obtain required times at each point in the logic network. The difference between the required time and the arrival time at any point is called the "slack" at that point, which determines whether or not the signal at that point satisfies its timing requirements.

As a complication, certain signals are not propagated to primary outputs, but rather, are latched into storage elements. In such a case, proper function of the logic network requires a particular relationship between the arrival times of the signal controlling the latching of the data (the clock) and the data signal being latched. These are called timing test points, and their required relationship is the "test" between those points. The required time of a signal involved in such a test can be obtained from the arrival time of the other signal involved in the test.

The propagated arrival and required times may be single numbers, ranges of values, statistical distributions, sets of random samples calculated based on expected delay distributions and correlations, or a parametric equation representing the arrival/required times as a function of some design variable(s). Delays along the paths may be simply added or subtracted, or statistical or symbolic addition/subtraction may be utilized. Since paths within a logic network can diverge (i.e., fan-out) and converge (i.e., fan-in), the timing analysis process must also have a way of combining the arrival or required times propagated to a point. This is typically done by taking the maximum or minimum value, but may also involve maintaining several separate values at each point. The tests performed at storage elements may also be simple value comparisons, or may involve taking statistical or symbolic differences.

If the logic network may operate in different modes with different timing requirements or different paths being enabled (e.g., early mode and late mode), several separate timing analyses may be required to verify that a particular design meets its timing requirements. These may occur in parallel, or may be done in separate invocations of the timing analysis tool.

The propagation of arrival and required times may be accomplished in several different ways. One approach is to "levelize" the design, which means to determine an ordering of network elements such that no element precedes any other element that feeds it. By computing the arrival times in such a levelized order, all values for the computation of a single time at point X (i.e., the values of the points feeding X) will already have been computed by the time the value for point X is to be computed. Required times are computed by traversing the levelized list in the reverse order.

Another approach is to use recursive subroutine calls. Since the arrival time at any point X depends on the points feeding point X and the delays from those points, a recursive call can be made to obtain an arrival time for each of these points, causing the arrival times at all points within the cone of logic feeding point X to be computed. To avoid tracing all paths through the cone (which may grow exponentially with the size of a design), once a value for a point is computed it is saved, and when a call is made to request a value at that point, the saved value is returned.

Various methods exist in the art for updating timing analysis values. One approach is presented by Dunlop et al. in U.S. Pat. No. 4,827,428 entitled: "Transistor Sizing System for Integrated Circuits." This patent describes a method/system for improving the design of an integrated circuit by interactively analyzing the circuit and improving it with each iteration until a preselected constraint is met. Using a convex function model, with each iteration a static timing analysis of the circuit is completed to identify the output that most grievously violates the specified constraint. With that output selected, an analysis of the path's timing structure identifies the active element in that path whose change in size would yield the largest improvement in performance. The size of that active element is adjusted accordingly and the iteration is repeated. No description is provided, however, as to how the timing recalculation is to proceed.

Another approach to timing analysis is presented by Drumm et al. in U.S. Pat. No. 5,003,487 entitled: "Method and Apparatus for Performing Timing Correction Transformations on a Technology-Independent Logic Model During Logic Synthesis." This approach utilizes a depth first propagation of timing changes caused by a modification (or modifications) to the circuit network, until no further timing change occurs. Because a depth first search may traverse the same sub-paths many times, the approach is much more computationally expensive than truly needed. Further, because the application or user calling for timing analysis is provided the ability to control when recalculation is performed, recalculation may occur too often, causing excessive recomputation, or may not be conducted when appropriate, causing invalid answers to be given by the timing analyzer. Therefore, an application writer must be thoroughly familiar with this recalculation method in order to avoid the potential problems.

A need continues to exist in the art of designing complex, high-speed circuit networks for an efficient technique for updating timing analysis results in response to a partial (or incremental) modification to the network being timed. The invention described herein addresses this need. Additionally, the concepts provided can be used for incremental recalculation of any value which is propagated forward (or backward) through a logic network (or any other directed acyclic graph) such that the value at a point in the graph depends only on the values of the points feeding (or fed by) it.

DISCLOSURE OF THE INVENTION

Briefly summarized, the present invention provides in one aspect a method for selectively performing timing analysis within a modified electronic circuit design resulting from a modification to an initial electronic circuit design having input nodes, output nodes, and active elements electrically connected therebetween in a set of signal paths interconnected by a plurality of nodes. Each signal path has a timing delay associated therewith. The method includes the steps of: providing an automated circuit timing analyzer that accepts data representing time values of a set of signals applied to the input nodes and determines relative time values at each of the plurality of nodes as the signals are propagated through the initial electronic circuit design; recording data representative of the modification to the initial electronic circuit design including determining and storing a leftmost frontier of change in the relative time values resulting from the modification to the initial electronic circuit design and a rightmost frontier of change in relative time values resulting from the modification to the initial electronic circuit design; receiving a request for timing analysis of a selected portion of the modified electronic circuit design; and conducting timing value analysis on the selected portion of the modified electronic circuit design including determining a relative timing value for one of the propagated signals at a node in the modified electronic circuit design utilizing the automated circuit timing analyzer and at least one of the stored leftmost and rightmost frontiers of change in the relative time values to limit the timing value analysis.

In another aspect, a method is presented for delayed analysis of a propagated signal value within a modified version of a given integrated circuit layout having a plurality of nodes. The method includes the step of: propagating the signal value within the given integrated circuit layout and storing based thereon relative signal values for at least some nodes of the plurality of nodes; modifying the given integrated circuit layout to produce the modified version thereof; recording data representative of a leftmost frontier of change in relative signal values and a rightmost frontier of change in relative signal values resulting from the modification to the given integrated circuit layout; receiving a request for an updated relative signal value at one of the nodes having a stored relative signal value associated therewith; and employing the recorded leftmost frontier of change and rightmost frontier of change data to determine the updated relative signal value without requiring full analysis of the modified integrated circuit layout.

In another aspect of the present invention, a method is provided for selectively performing timing analysis within a modified electronic circuit design resulting from an incremental modification to an initial electronic circuit design. The initial electronic circuit design includes input nodes, output nodes, and active elements electrically connected therebetween in a set of signal paths interconnected by a plurality of nodes. Each signal path has a timing delay associated therewith. The incremental modification affects relative time values for at least some of a set of signals propagated through the initial electronic circuit design. The method includes the steps of: recording data representative of the frontiers of change in relative timing values effected by the incremental modification to the initial electronic circuit design; receiving a request for an updated, incremental timing analysis of the modified electronic circuit design which requires timing analysis of at least one node having its relative timing value changed by the incremental modification; and retrieving the frontiers of change data and conducting the requested, updated incremental timing analysis. Conducting the updated incremental timing analysis includes calculating an updated relative timing value for the at least one node having its relative timing value changed by the incremental modification.

Enhancements to each of the above-outlined methods are presented and claimed herein. In addition, an analyzer system is presented. This analyzer performs selective timing analysis upon a revised electronic circuit design resulting from a modification to an initial electronic circuit design. The initial electronic circuit design includes input nodes, output nodes and active elements electrically connected therebetween in a set of signal paths interconnected by a plurality of nodes. Each signal path has a time delay associated therewith. The incremental timing analyzer includes an automated non-incremental circuit timing analyzer that accepts data representing time values of a set of signals applied to the input nodes and determines relative timing values at each of the plurality of nodes for the signals as propagated through the initial electronic circuit design. Memory means records data representative of a leftmost frontier of change in relative timing values resulting from the modification and a rightmost frontier of change in relative timing values resulting from the modification. Further, incremental processing means are provided for determining a timing value for a propagated signal at a selected node in the modified electronic circuit design. The incremental processing means utilizes the automated non-incremental circuit timing analyzer and at least one of the recorded leftmost and rightmost frontiers of change to limit the timing value analysis to update only those nodes necessary to determine the timing value at the selected node. Additional enhancements to the incremental timing analyzer are also presented.

The methods/analyzer systems presented herein each employ a novel technique for selectively performing timing analysis in an incremental manner on a modified electronic circuit design resulting from one or more modifications to a given electronic circuit layout. With each modification to the given electronic circuit layout data is recorded in a arrival time recalculation list and a required time recalculation list such that frontiers of change in relative time values for those nodes affected by a given modification are assembled. These frontiers of change then allow a deferral in the recalculation of relative time values until specifically requested by an application program or user.

Additionally, once a request for an updated timing value is presented, the cumulative frontiers of change in relative timing values are employed to limit timing value recalculation to only those nodes necessary to answer the specific query. Preferably, the frontiers of change are in a sorted order within their respective recalculation lists to limit unnecessary repeated computation of a timing value at any given point. Further reduction in the recalculation process may be obtained by employing fan-in sets and fan-out sets in combination with the technique disclosed. Also, described herein is an approach to handling required times which depend on arrival times.

Finally, the concepts presented may be used for incremental recalculation of any signal value propagated forward or backward through a logic network (or any other directed acyclic graph) such that the value at a point in the graph depends only the values on the points feeding (fed by) it. Examples include incremental update of simulation values, controllability and observability information used in test generation, controllability information used in logic synthesis, etc.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 1b is a delay graph corresponding to the sample logic circuit model of FIG. 1a;

FIG. 2a is another sample logic circuit model useful in describing selective, incremental timing analysis pursuant to the present invention;

FIG. 2b is a delay graph corresponding to the sample circuit logic model of FIG. 2a;

FIG. 3 is a high level diagram of a computer system employing incremental circuit analysis pursuant to the present invention;

FIG. 6 is a block diagram of one embodiment of an arrival time recalculation list (ATRL) or a required time recalculation list (RTRL) pursuant to the present invention;

BEST MODE FOR CARRYING OUT THE INVENTION

Figure 1A:
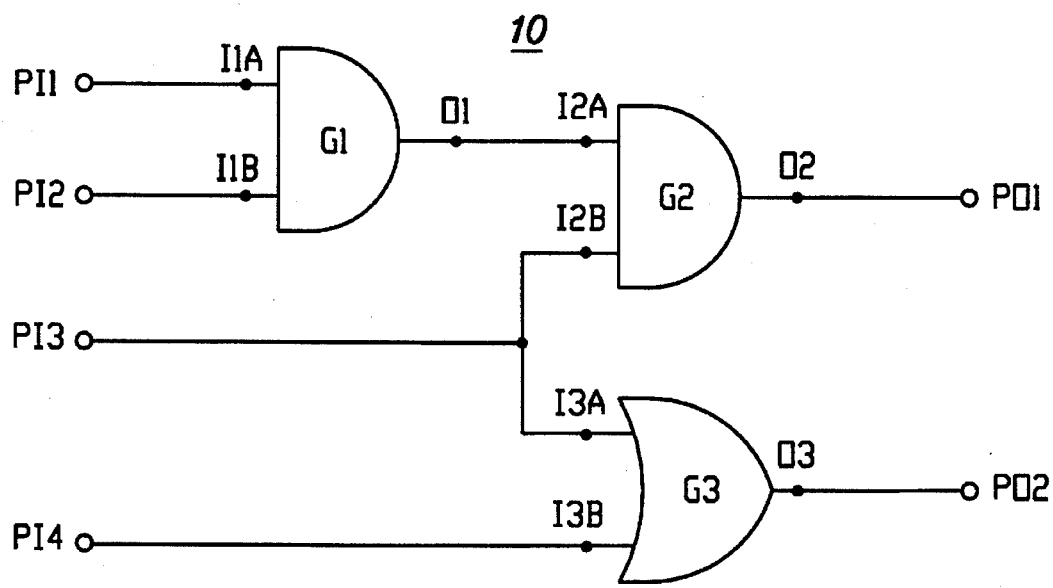
FIG. 1a is a sample logic circuit model useful in describing selective, incremental timing analysis pursuant to the present invention.

Very large scale integration (VLSI) has been made possible by an ever improving technological ability to create complex electronic circuits. Efficient design of VLSI circuits cannot be had without some automatic means for designing the interconnection patterns and for designing the layout of the circuits, including the creation of the active elements within the circuits. Not unexpectedly, therefore, there are a wide variety of products available in the art to assist in the design of VLSI circuits. An integral part of all such design tools is a mechanism for evaluating the efficacy of the design. Timing analysis is one such tool, and the present invention is described herein principally in relation to such a timing analysis tool.

Algorithms, such as those discussed initially herein, exist in the open literature which present static, non-incremental timing approaches to the complete updating of timing analysis results in a logic circuit network. However, there are few, if any, truly "incremental timing analyzers" such that only partial timing analysis of a logic circuit design is needed subsequent to one or more model modifications. The present invention provides one such analyzer.

As described further below, this invention does employ a conventional, underlying timing analysis approach, but in a new way. Preferably, a timing analyzer pursuant to the present invention uses both levelization and recursive analysis techniques in a novel manner as explained herein. However, it should be noted that the incremental approach presented is easily applicable to use with other static timing analysis techniques known in the art.

Refer to the drawings wherein the same reference numerals/characters may be used throughout multiple figures to designate the same or similar components. FIG. 1 is an example of a logic circuit model having four input nodes (PI1, PI2, PI3, PI4) and two output nodes (PO1 & PO2). A set of signal paths exist between the input nodes and the output nodes such that timing signals propagated therebetween experience different delays characteristic to each particular signal path. Model 10 includes three gates, namely, two AND gates (G1 & G2) and an OR gate (G3). Points (or nodes) within the delay circuit model (i.e., besides the input nodes and output nodes) include I1A, I1B, I2A, I2B, I3A, I3B, O1, O2 & O3.

Figure 1B:
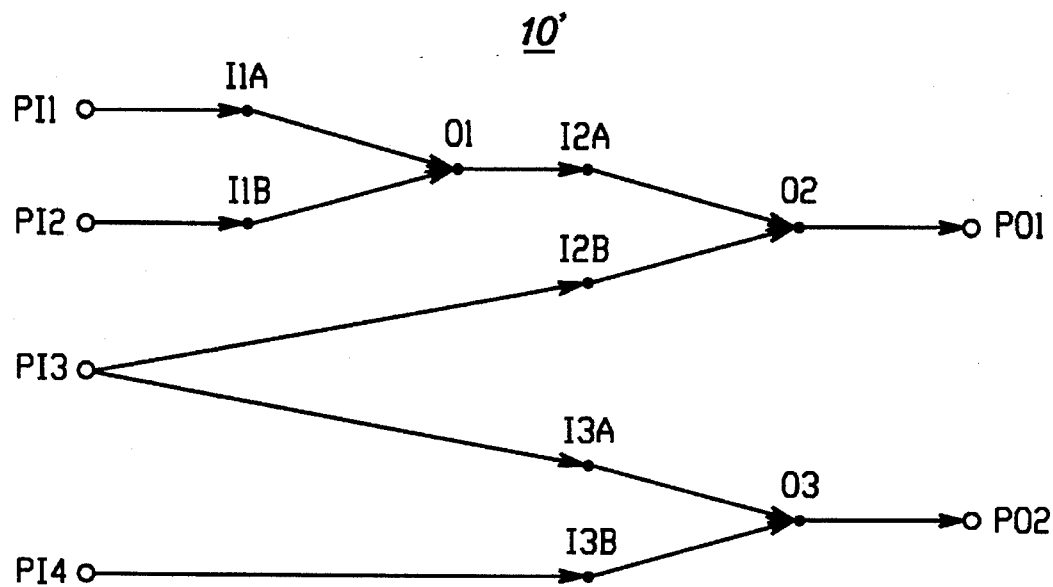

FIG. 1b depicts a delay graph 10' for logic circuit model 10 of FIG. 1a. The delay graph represents the signal paths or delay paths between the various points of the logic circuit model. (As can be seen in this figure, input node PI3, is the only point in the model having a fan-out consisting of multiple sink points.) A principal object of the present invention is to provide the ability to modify a particular data path or its characteristic delay, while deferring timing circuit analysis until specifically requested by an application program or user, and then only conducting a partial (or incremental) timing update sufficient to answer the specific timing request (herein referred to as "incremental timing analysis").

Thus, the present invention generally divides timing analysis into two parts. A first part comprises recording change(s) to a logic circuit model, while a second part concerns propagating time changes within the logic circuit model only in response to a particular request and only to the extent necessary to answer that request (for example, for an arrival time or required time at a particular point in the circuit model). Changes to the logic circuit model are recorded for subsequent timing analysis only if a change in the network affects timing. The demand driven propagation of timing changes is needed to ensure that a requested value is accurate. Again, the presented processing division pursuant to this invention allows recalculation of timing results to be deferred until the results are needed, thereby reducing the possibility of repeatedly computing updated timing results which may never be used (e.g., due to a series of changes affecting timing within a portion of the logic circuit model).

By way of further example, a test edge logic circuit model, generally denoted 12, is presented in FIG. 2a. This logic circuit model comprises a latch 14 having input points PI5 & PI6 and an output point PO4. Latch input points PI5 & PI6 are tied to a data input (ID) and a clock input (IC), respectively. An output signal on latch output O4 is provided to output point PO4. Proper function of such a logic network requires a particular relationship between the arrival times of the signal controlling the latching of the data (i.e., the clock signal at point IC) and the data signal being latched (at point ID). These points are termed the timing test points and the required relationship is the "test" between these points. A required time of a signal involved in such a test can be obtained from the arrival time of the other signal involved in the test.

A delay graph 12' is depicted in FIG. 2b for logic circuit model 12 of FIG. 2a. The phantom line between data point ID and clock input point IC is a representation of the relationship between these two latch input points. This relationship is referred to as the "test edge" for setting up of the test. The incremental timing analyzer of the present invention can be employed with a logic circuit model such as that depicted in FIG. 1a or a test edge logic circuit model such as that depicted in FIG. 2a, both of which would obviously be presented in much more complex circuit arrangements.

A note on terminology. The terms "leftmost" and "rightmost" are used herein below. For purposes of this discussion, a point in a circuit network is considered to the right of all points which feed it, and to the left of all points it feeds. Therefore, leftmost points in a set are those which are to the right of no other points in the set (i.e., to the left of all other points in the set); and rightmost points of a set are those points to the left of no other points in the set (i.e., to the right of all other points in the set).

An incremental timing analyzer pursuant to the present invention, along with the underlying non-incremental timing analyzer employed, are stored in and utilized by any appropriately configured/sized computer system, denoted 20 in FIG. 3. Computer system 20 includes a CPU 22, a memory 24 and appropriate I/O devices 26. Contained within memory 24 may be the application program, the logic model database, and an incremental timing database pursuant to the present invention. As described herein below, the incremental timing database will direct processing and include an arrival queue (also referred to herein as an "arrival time recalculation list" (or ATRL)) and a required queue (also referred to herein as a "required time recalculation list: (or RTRL)). Model modifications and model queries (including timing queries) originate with a user interfaced with, or application program running on, CPU 22.

Figure 4:
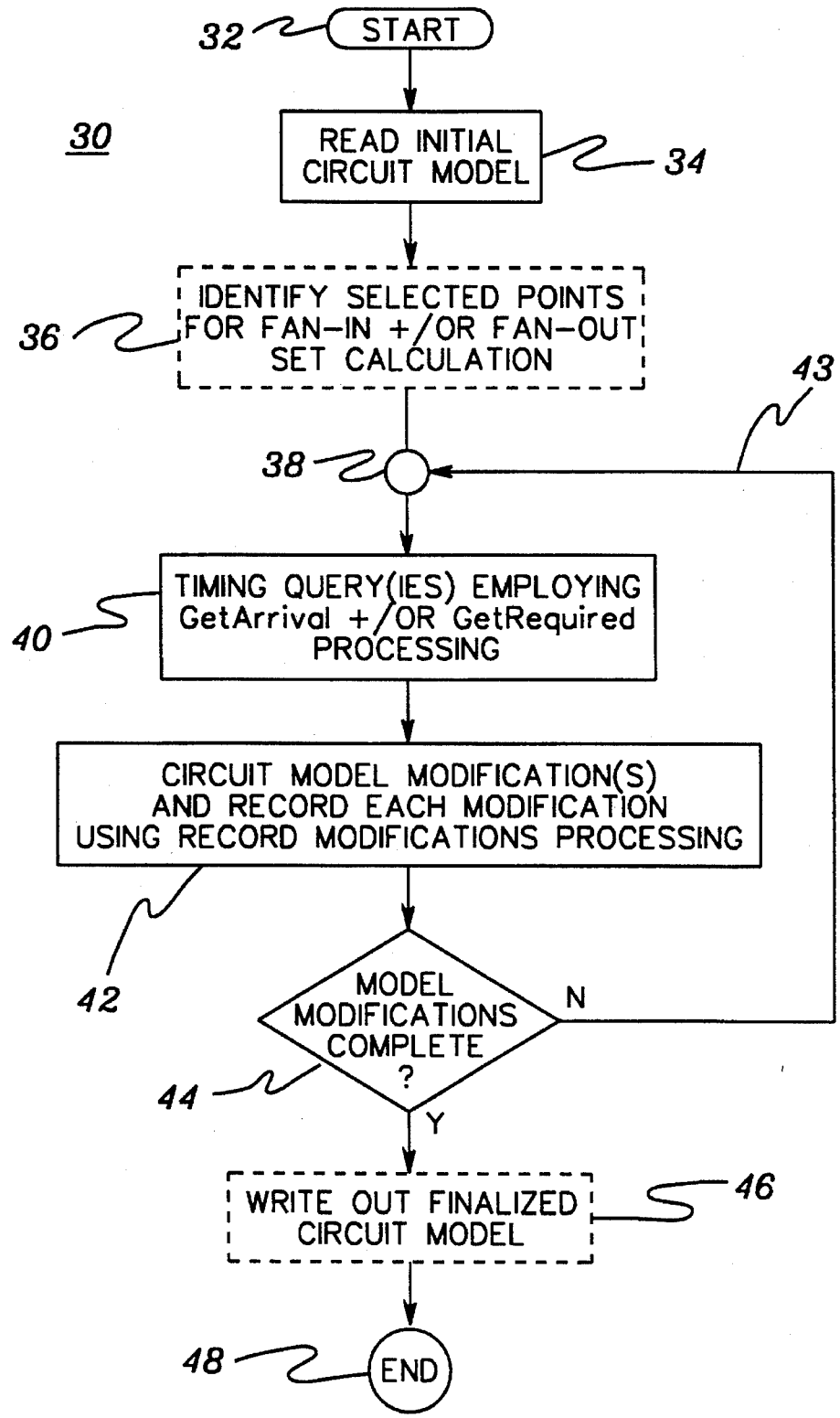
FIG. 4 is a flowchart of one embodiment of incremental timing analysis pursuant to the present invention.

One processing embodiment, denoted 30, of incremental timing analysis pursuant to the present invention is presented in FIG. 4. In this embodiment, timing analysis begins, 32 "Start," with an initial logic circuit model, 34 "Read Initial Circuit Model." As an option, and as described below, fan-in and/or fan-out set calculations may next be employed for selected points of the logic model, 36 "Identify Selected Points For Fan-in and/or Fan-out Set Calculation" (shown in phantom). From instruction 36 (or if omitted from the flow, then from instruction 34) processing proceeds via junction 38 to respond to an initial timing query employing GetArrival and/or GetRequired processing pursuant to the present invention, 40 "Timing Query(ies) Employing GetArrival and/or GetRequired Processing." Embodiments of a GetArrival processing routine and a GetRequired processing routine pursuant to the present invention are described below in connection with FIGS. 7a–7b and FIGS. 8a–8c, respectively. In a first pass through the incremental timing analysis routine, instruction 40 establishes base arrival and/or required times for each point in the logic circuit model.

Subsequent to initial query processing, one or more circuit model modifications may be made by a user or application program. Pursuant to the invention, information characteristic of each circuit model modification is recorded by a record modification(s) process such as that depicted in FIG. 5 and described below, 42 "Circuit Model Modification(s) And Record Each Modification Using Record Modifications Processing." After recording model modifications, a determination is made whether all model modifications have been completed, 44 "Model Modifications Complete?" If "no", then a feedback loop 43 returns processing flow to junction 38, and hence instruction 40 for the execution of any timing query. After all model modifications have been completed, an optional write out of the finalized circuit model, 46 "Write Out Finalized Circuit Model," may be employed after which processing pursuant to incremental timing analysis of the present invention terminates, 48 "End." Timing analysis instruction 40 and modification recording instruction 42 are each described in detail herein below, beginning with the recording of information characteristic of one ore more circuit model modifications.

Figure 5:
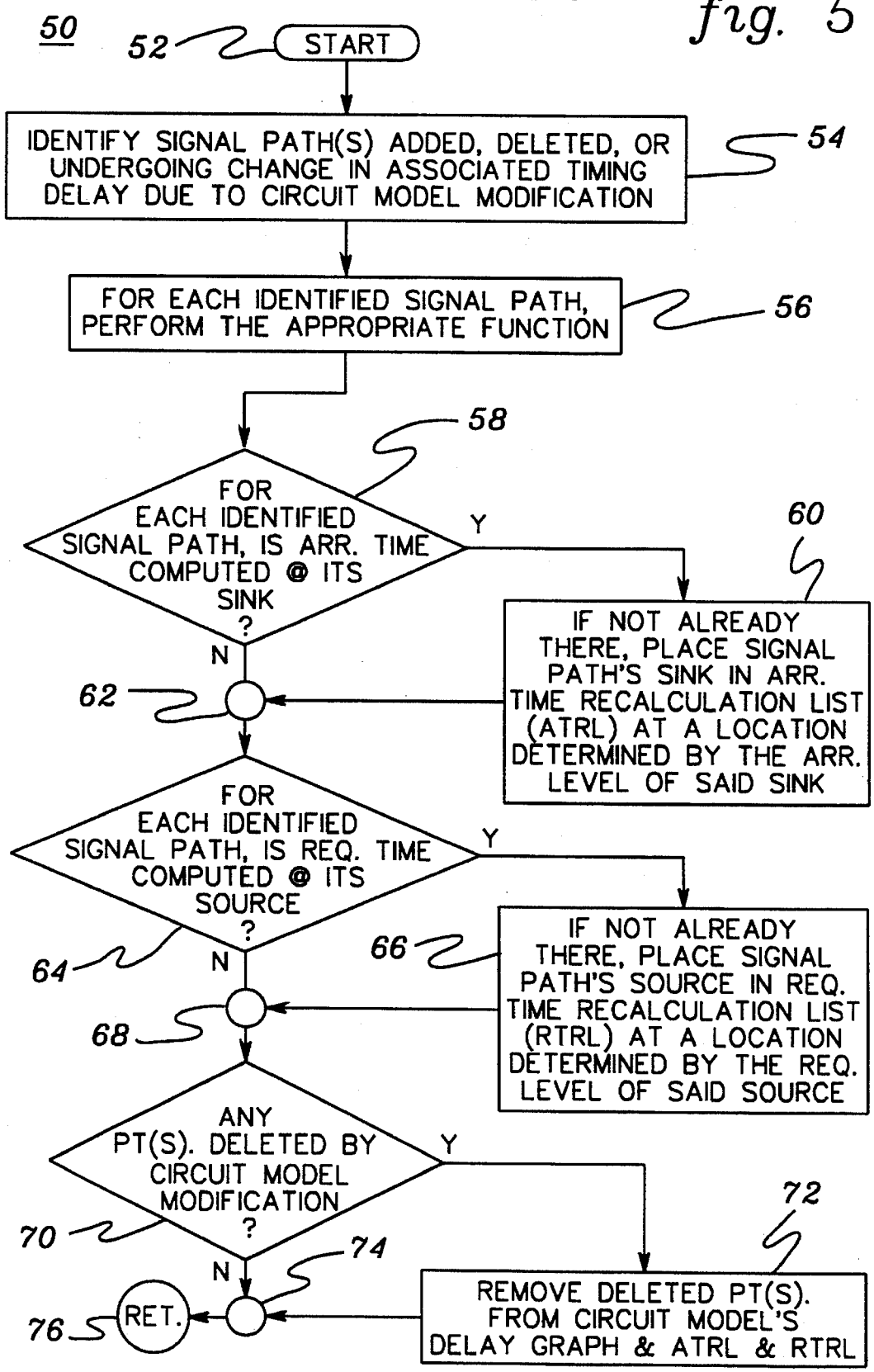
FIG. 5 is a flowchart of one embodiment of record modification processing employed by the incremental timing analysis process of FIG. 4.

FIG. 5 depicts a processing flow of one such instruction pursuant to the present invention. Processing flow 50 begins, 52 "Start," by identifying a signal path(s) which has been added, deleted or has an associated timing delay modified due to a change in the circuit model, 54 "Identify Signal Path(s) Added, Deleted, Or Undergoing Change In Associated Timing Delay Due To Circuit Model Modification." Many types of logic network changes can affect timing. Examples include the addition, deletion, connection, or disconnection of a pin, a change in the binding of circuits (i.e., changing a circuit from one type to another), and changes to network parameters or attributes which affect timing (e.g., a change in net capacitance). Generally, these changes affect timing through some local change such as a change in a delay value and/or in the connection of a delay path (i.e., an edge in the delay graph), and the propagated effect of the local changes. All such changes may result in one or more of the following three types of changes to a timing analysis graph (i.e., delay graph):

1. Addition of a delay path between a pair of points;

2. Deletion of a delay path between a pair of points; and

3. Changes in the delay associated with a delay path between a pair of points of the logic circuit model.

When a network change is made, any stored local timing related data (for example, delay times) are discarded. Employing a recursive timing analysis method such as that described herein below means that these values will be recomputed when needed at a later date. Alternatively, they could be recomputed immediately depending upon the underlying timing analysis approach.

Returning to processing flow 50, for each identified signal path the appropriate function, i.e., addition, deletion or change in associated delay, is carried out, 56 "For Each Identified Signal Path, Perform The Appropriate Function." Instructions 54 & 56 essentially comprise standard processing pursuant to most non-incremental timing analyzers. These instructions typically direct that the requested modification be conducted on a base delay graph or on the logic model from which such a delay graph is generated. From instruction 56 processing is unique pursuant to the present invention.

After appropriate delay graph modifications, inquiry is made into whether for each identified signal path an arrival time is computed at its sink (i.e., one or more points fed by the subject delay path), 58 "For Each Identified Signal Path, Is Arr. Time Computed At Its Sink?" If the arrival time at the subject sink has already been computed and if the subject sink has not already been placed in an arrival time recalulation list (ATRL), then the processor places the signal path's sink in the ATRL at a location determined by the arrival level assigned to the sink, 60 "If Not Already There, Place Signal Path's Sink In Arr. Time Recalculation List (ATRL) At A Location Determined By The Arr. Level Of Said Sink."

As noted briefly above, the present invention employs two separate recalculation lists, herein referred to as the arrival time recalculation list (ATRL) and the required time recalculation list (RTRL). Each of these lists comprises a memory space or queue, for example, in memory 24 of computing system 20 depicted in FIG. 3. FIG. 6 depicts one embodiment for a recalculation list wherein the memory space is indexed by level numbers assigned to the points of the logic circuit model. By way of arbitrary example, index level 0 is assumed to contain points A & B, index level 1 contains point X, index level 2 is empty and index level 3 contains points Y, Z & W. Preferably, points stored to the ATRL and RTRL are indexed to avoid unnecessary recalculations of requested times as described herein below.

The arrival time recalculation list (or arrival queue) contains those points fed by an affected delay path, while the required time recalculation list (or required queue) contains those points feeding the affected delay path(s). These points, which are the leftmost and rightmost sets of points affected by a given change, are also referred herein as the "frontiers of change." The frontiers of change move as recalculation progresses, so that the arrival (required) time frontier contains the leftmost (rightmost) set of points affected by any changes which have not yet had their times recalculated as a result of those changes. The overall frontier is the union of the frontiers of the individual changes, so that as multiple changes for which recalculation is not complete have been made along a path, there may be multiple frontier points in that path due to the various changes. The frontier, therefore, may not be the minimal set of leftmost (rightmost) points which are invalid due to all changes. An explicit change to an arrival or required time which does not affect the associated delay or the delay path itself (for example, a change in a user timing assertion) is also recorded in the appropriate list.

If the arrival time for the sink has not already been computed, processing proceeds via junction 62 to inquire into whether the required time has been computed for the point source of the identified signal path, 64 "For Each Identified Signal Path, Is Req. Time Computed At Its Source?" (Alternatively, from instruction 60 processing proceeds via junction 62 to inquiry 64.) Assuming that the required time for the source point is available and the source point has not already been placed in the RTRL, then the required time is saved in the recalculation list at a location determined by the required level of the source point, 66 "If Not Already There, Place Signal Path's Source In Req. Time Recalculation List (RTRL) At A Location Determined By The Req. Level Of Said Source."

The points in these recalculation lists (ATRL and RTRL) are preferably stored in a sorted order, so that the leftmost points in the arrival time recalculation list appear first, and the rightmost points in the required time recalculation list appear first. If all delays in the network are positive this ordering may be achieved merely by sorting the arrival time recalculation list on the increasing arrival time and the required time recalculation list on the decreasing required time. Otherwise, specific forward and backward level numbers (such as those employed by the levelization technique noted initially) can be computed for each point in the network, which can be accomplished while computing the original arrival and required times, respectively.

The arrival (required) level numbers must obey the property that: the level number of each point is less than those of any of the points fed by (feeding) it. (Negative delays can occur as an artifact of certain types of delay modeling, or in the form of user "adjusts.") The level numbers, arrival times (or required times) used to sort the points into the appropriate recalculation list are those associated with the point before timing recalculation. Sorting of each list is preferably employed to eliminate unnecessary recalculation of the same values during change propagation, and need not be exactly correct. To reduce the time needed to sort new points into a list, the points may be sorted into blocks, (or "buckets") with each block containing points of the same level number, or with the same arrival/required times within a certain predefined (small) range. A point is only placed in a recalculation list once (at any given point during the processing), even though it may be in the frontier of several changes.

Continuing with FIG. 5, if required time has not been computed for the subject source point(s) processing proceeds via junction 68 to inquiry 70, "Any Pt(s). Deleted By Circuit Model Modification?" If a point of the logic circuit layout has been deleted by one of the model modifications, then the deleted point is removed from the circuit model's delay graph and recalculation list, 72 "Remove Deleted Pt(s). From Circuit Model's Delay Graph & ATRL & RTRL." If no points have been deleted, or after any deleted point has been removed from the delay graph and appropriate recalculation list, processing passes via junction 74 to return, 76 "Ret.," to the point of call in the main incremental timing analysis flow of FIG. 4.

As already noted, an important aspect of the present invention is the concept of delaying timing recalculation until an updated timing value is specifically requested by an application program or user. Thus, changes are propagated only when a request for a timing value is made. The arrival (required) time recalculation is done by removing the first point from the arrival (required) time recalculation list and computing its new arrival (required) time. The points fed by (feeding) the recomputed point are next sorted into the arrival (required) time recalculation list based on the old (pre-recalculation) arrival time, required time or level number. The process then repeats with a new first point on the list. If the lists are sorted based on level numbers, these may also change as a result in changes in connections within the network and must be computed at the same time (discussed further below).

Since in the embodiment presented the lists are sorted by level number of arrival (required) time, the first element in each list will always be one of the leftmost (rightmost) points with an invalid arrival (required) time. Thus, the arrival (required) times to the left (right) of the point being recomputed, and on which the recomputed value depends, are generally valid. If the sorting is not precisely correct (as may occur if a bucket sort is based on an arrival/required time range instead of level number), a situation may occur where point A is fed point B, but appears before point B on the arrival time recalculation list. In this case, the new value computed for point A will be wrong, but when the value for point B is subsequently recalculated, point A will be put back in the list (because it is fed by point B) and the value computed for point A the next time will be correct (described below). Thus, the method presented herein is tolerant of errors in the sorting of the recalculation list, at the possible cost of a small amount of extra recalculation.

Recalculation processing preferably continues until one of the following predefined conditions occurs:

1. The newly computed value is the same as the old value at a subject point. If the lists are being sorted based on level numbers, the new level number of the point must also be less than or equal to its old level number to maintain the property that the level number at a point is always less than the level numbers of the points it feeds (is fed by).

2. No value was previously computed for the point. Since all values to the right (left) of a point depend on the value at that point, if no value is present at a point there can be no invalid values at any of the points to the right (left) of the point which needs to be updated. This is only applicable if the underlining timing analyzer is of the recursive, depth first search type.

3. For a query at point X, the (old) level number or arrival time is greater than the maximum level number or arrival time of X during a recalculation. More specifically, the maximum of the old level number or arrival time at point X (i.e., before the propagation began) and the new values that might be assigned to point X during the propagation are considered. This can cause multiple new values to be propagated to point X during one wave of recalculation, as described below.

Since points with level numbers or arrival times greater than those of point X cannot affect the value on point X, there is no need to recompute them. Thus, the maximum value at point X is a limit to avoid a problem shown by the following sequence. A logic sequence is assumed whereby point A feeds (through a logic block with delay 2) point B, which in turn feeds (through another logic block with delay point C. Processing is assumed to proceed as follows:

a. A change is made at point A, causing its level number or arrival time to increase.

b. The change is propagated (due to some query) to point B with a higher level number/arrival time than that at point C.

c. The change at point A is undone, which will cause the "right" value on point B to go back to it's old value which was less than the value at point C.

d. A query is made at point C. If the original value on point C is used as a limit, the change whose frontier is now at point B will be propagated to point C, and the second change will not be propagated all the way to point C, because its value (due to the propagation of the first change) is too high.

TABLE 1

| A arrival time | B arrival time | C arrival time | Arrival time recalculation list | Comment |
| --- | --- | --- | --- | --- |
| 1 | 3 | 5 | | Initial state |
| 1* | 3* | 5* | A | Arrival time at A increases by 3 |
| 4 | 3* | 5* | B | Recalculate A, add B to list |
| 4 | 6 | 5* | C | Recalculate B, add C to list, answer query at B |
| 4* | 6* | 5* | A, C | Arrival time at A changes back |
| 1 | 6* | 5* | C, B | Reclaculate A, add B to list |
| 1 | 6* | 8* | B | Recalculate C |
| 1 | 3 | 8* | C | Recalculate B, add C to list |
| 1 | 3 | 5 | | Recalculate C, answer query at C |

In Table 1,* indicates an error value which needs to be recalculated. For the required time recalculation list sorted by required times, propagation continues until an old required time is less than the minimum required time at point X. (The example of Table 1 will be clearer from the following discussion of FIGS. 7a & 7b and FIGS. 8a–8c.)

The above limits on the recalculation process are intended to restrict the process to recalculating only that information required to answer a particular query of the application program or user. One detailed embodiment of GetArrival processing is next discussed below with reference to FIGS. 7a & 7b. FIGS. 9a–9d & 10a–10e will be used to discuss operation of this GetArrival processing flow.

Figure 7A:
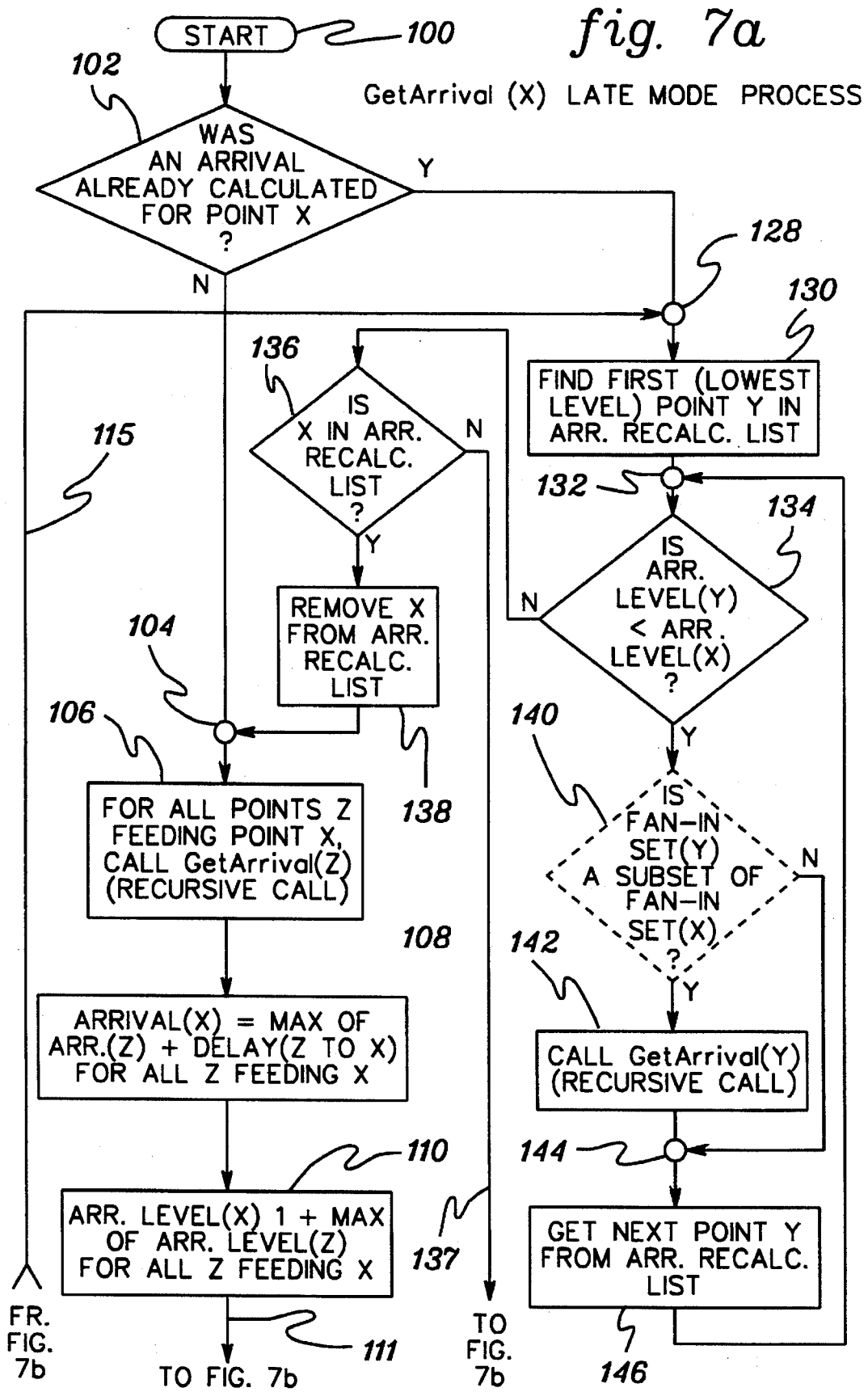
FIGS. 7a & 7b comprise a flowchart of one embodiment of GetArrival processing employed by the incremental timing analysis process of FIG. 4.
Figure 7B:
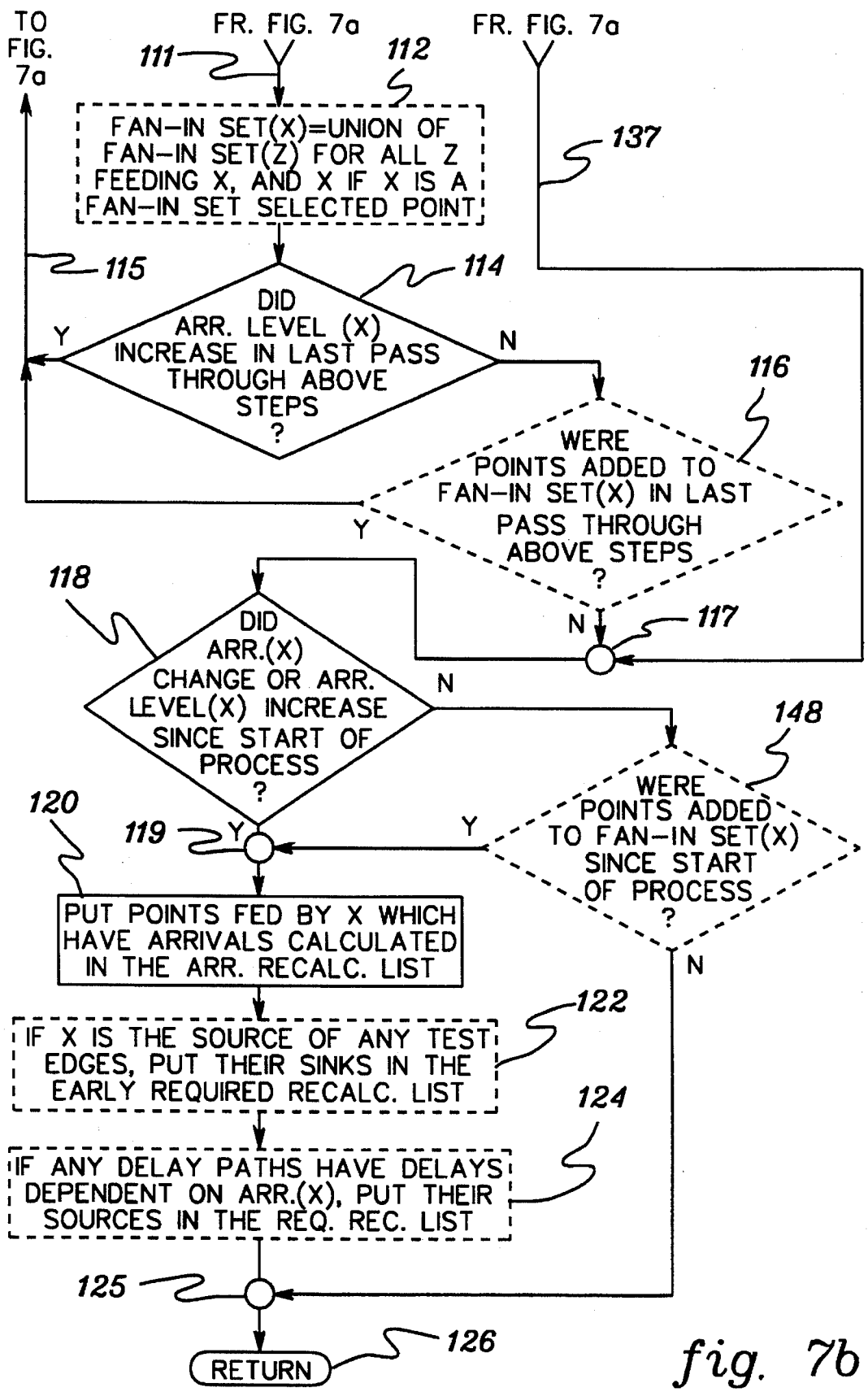

First, however, it should be noted that the GetArrival processing embodiment presented in FIGS. 7a & 7b comprises a "late mode" arrival time process for a point X in a logic circuit model. Those skilled in the art will understand that a similar processing flowchart could also be employed for "early mode" arrival time recalculation. A brief discussion of "late mode" versus "early mode" timing analysis follows.

The most common question asked in timing analysis is: "Did a particular signal transition arrive soon enough to meet the timing specification?" This involves computing the maximum possible arrival times and delays and the minimum possible required times in a delay graph (a process referred to here as "late mode timing analysis"). It is also possible to ask the question: "Did a particular signal transition arrive too early for the timing specification?" This involves finding the minimum possible arrival times and delays and the maximum possible required times in the delay graph (a process referred to here as "early mode timing analysis").

Required times may come from specifications imposed by the designer at the primary outputs of the design. They may also come from specified relationships, such as tests, between the arrival times at various points within the design. For example, a setup test may require that a data signal transition arrive at the data pin of a latch some specified time before the clock signal transition arrives at the clock pin of that same latch, or a hold test may require that the next data signal transition not arrive at the data pin of a latch until some specified time after the clock signal transition arrives at the clock pin of that same latch.

A required time due to a test is derived from the arrival time at the other point involved in the test, and obtaining the minimum such required time due to the test (i.e., a late mode required time) must be done using the minimum arrival time at said other point (i.e., an early mode arrival time). Likewise, an early mode required time due to a test is computed using a late mode arrival time at the other point involved in the test. Thus, a test can be modeled as a special type of edge in the delay graph, called a "test edge", which imposes a late mode required time at one end (designated as its source) derived from an early mode arrival time at its other end (designated as its sink), and likewise imposes an early mode required time at its sink derived from a late mode arrival time at its source.

These concepts of late and early mode timing analysis and of test edges are well understood in the field of timing analysis. Thus, while the flowcharts used to describe the invention apply to the calculation of late mode arrival and required times, it is a simple matter to modify them to compute early mode values instead, or concurrently.

Referring now to FIGS. 7a & 7b, GetArrival processing begins, 100 "Start," with an inquiry into whether a subject point X in the logic network has had an arrival time already calculated, 102 "Was An Arrival Already Calculated For Point X?" If "no" (for example, this may be the first time through processing 30 of the incremental timing analysis routine set forth in FIG. 4), processing passes through junction 104 to instruction 106 "For All Points Z Feeding Point X, Call GetArrival (Z) (recursive call)." Instruction 106 directs the processor to determine arrival times for those points Z feeding point X. These recursive calls will terminate when a point is reached for which previous arrival times have been computed, yielding a "yes" answer to inquiry 102. The arrival times at points Z will then be used to determine the arrival time at point X. Thereafter, the arrival time of point X is determined, 108 "Arrival(X)=Max of Arrival(Z)+ Delay(Z to X) For All Z Feeding X," along with the arrival level at point X, 110 "Arr. Level(X)=1+Max of Arr. Level(Z) For All Z Feeding X."

Processing continues in FIG. 7b (via line 111) at instruction 112, which is shown in phantom as being an optional improvement to a basic processing flow according to the present invention. This instruction, along with inquiry 116 and inquiry 148 relate to the optional use of fan-in sets and fan-out sets. Briefly described, fan-in and fan-out set calculations may be employed to reduce further the amount of recalculation performed in incrementally updating a timing value.

In doing incremental arrival time recalculation (a similar situation occurs for required time recalculation), the goal is to recalculate only those points which are in the fan-in cone of the point at which a current arrival time query is made. Keeping track of this relationship in general requires either a O(N**2) memory space (to maintain a list at each point of all (N) other points which feed it) or a search through the fan-in or fan-out cones of the subject point, which in general takes as much time as conventional recalculation. Therefore, recalculation is preferably limited by level number or arrival time, which might cause the unnecessary recalculation of many points.

An enhancement is to select some small set of points and to keep track at every point in the network which of these points is in the fan-in cone of that point. That information is then used to further limit the propagation required to insure the correct arrival time at a point.

To determine if some point A is in the fan-in cone of another point B (and hence whether the arrival time at point A must be recalculated to answer a query about the arrival time at point B), we determine whether the set of selected points in the fan-in cone of point A is a subset of those in the fan-in cone of point B (i.e., if fan-in (A) AND not fan-in (B) is empty). If this is not true, point A is not in the fan-in cone of point B.

The fan-in set for a point is computed by setting the set for each beginning point of a path to the empty set if the input is not one of the selected set of points, and to the set containing only that point if it is in the selected set. At each point, the set becomes the union of the sets for all points feeding the point, plus that point itself if it is one of the selected set of points.

Bit vectors can be used to efficiently record whether a point is in a fan-in cone, and bit operations (OR, AND, NOT) can be used to compute these vectors and to use them in determining fan-in cone inclusion. Further, a single bit may be used to represent a set of points in the network. Because the size of the set is limited (e.g., to the number of bits in a full word in the computer), the size required is no longer O(N**2). The method still may allow recalculations that are not necessary, but the probability of this is reduced by good selection of the elements of the set of points, and by increasing the size of that set. This allows a trade-off between space required and the amount of unnecessary recalculation.

For required time calculation, the same type of calculation can be used to determine points included in the fan-out cones of other points. Typically, good points to choose are at or close to the beginning of delay paths. For fan-in sets, primary inputs or the outputs of registers are good choices, and for fan-out sets, primary outputs or the data pins of tests are good choices.

As noted above, an array of buckets is preferably employed within each list to maintain points which are queued to be updated in an order sorted by level. Unfortunately, it is not possible to sort the points by fan-in set, since the fan-in sets form only a partial order. It will be necessary to search through the contents of each bucket to find the points which are proper subsets to propagate.

Note that the use of subsets for limiting calculations is very similar to the use of level numbers. Note the following similarities in Table 2

TABLE 2

| level test | subset test | conclusion |
| --- | --- | --- |
| level(A) < level(Z) | fan-in(A) ⊆ fan-in(Z) | there may be a path from A to Z |
| level(A) ≧ level(Z) | fan-in(A) ⊄ fan-in(Z) | there is no path from A to Z |

For improved performance, both tests may be used simultaneously. If so, the arrival times at point A are recomputed in response to an arrival time query at point Z only if level(A)<level(Z) and fan-in(A)⊂fan-in(Z). Wherever a comparison of levels is used in the algorithms described herein, a comparison of fan-in sets may be substituted or used in addition. Since the question of interest for the proposed algorithms is whether there is a path, the analogy goes quite far, as is shown by the following example.

When level numbers at the point being queried change (increase) during recalculation, new points may have a lower level number, and must also be recalculated before it can be assumed that the value at the point being queried is correct. Similarly, when the fan-in set at the point being queried changes during recalculation, new points may satisfy the condition described above, and must also be recalculated before it can be assumed that the value at the point being queried is correct.

Returning to the GetArrival processing flow of FIG. 7b, if fan-in set calculation is employed, instruction 112 is performed, 112 "Fan-inSet(X)=Union Of Fan-inSet(Z) For All Z Feeding X, And X If X Is A Fan-in Set Selected Point." Inquiry is then made as to whether the arrival level of X increased, 114 "Did Arr. Level (X) Increase In Last Pass Through Above Steps?" If "yes", then processing returns (via line 115) to junction 128 (FIG. 7a) at the input to instruction 130 (discussed below).

Assuming that this is the first time through the GetArrival processing, then there is no old arrival time and, therefore, there no increase in arrival level at point X and processing defaults to inquiry 116 (i.e., if the above-described fan-in set processing is employed), 116 "Were Points Added To Fan-in Set(X) In Last Pass Through Above Steps?" If "Yes", processing again returns to junction 128 (FIG. 7a). If "no", processing proceeds via junction 117 to inquire further whether the arrival time of X changed or the arrival level of X increased since the start of the present processing, 118 "Did Arrival(X) Change Or Arr. Level(X) Increase Since Start Of Process?" If there has been an arrival time change at point X or an arrival level increase at point X, then (via junction 119) the arrival frontier is adjusted so that those points to the right of point X become part of the new frontier, 120 "Put Points Fed By X Which Have Arrivals Calculated In The Arr. Recalc. List." Again, an object of the present invention is to recalculate (i.e., update) timing for only those points needed to answer a specific query with the potential invalidity of other points in the logic network design being designated by the arrival and required frontiers held in the ATRL and RTRL, respectively.

Instructions 122 & 124 of the GetArrival embodiment presented in FIGS. 7a & 7b comprise another optional enhancement to the present invention. Specifically, in some delay models, a value may depend on the path taken to the source of the delay edge in the delay graph. For example, delay may depend on input slew, and since a block's output slew depends on its input slew, the slew used to calculate such a delay needs to be computed from the input slew on the previous block associated with the input pin which caused the latest (in late mode analysis) arrival time at the output of that previous block. Thus, since the required time depends on the delay, and the delay depends on the latest path to the point (which is determined by relative arrival times), the required time indirectly depends on the arrival time.

Also, when a delay graph includes test edges, the required time at one end of the test edge (e.g., the data pin of a latch) depends on the arrival time at the other end of the test edge (e.g., the clock pin of the latch). So again, the required time can depend on an arrival time.

More generally, the problem exists when there is a quantity which is calculated during backward propagation (e.g., required time) which is (directly or indirectly) dependent on a value calculated during forward propagation (e.g., slew or arrival time). For instance, imagine a delay model in which the slew depends on the previous slew, which depends on the slew before it, etc., but the slew at an output is the largest slew, not the slew associated with the largest arrival time. In this case, the arrival times have no influence on the delay. It is not the arrival time, but the slew which needs to be propagated over all paths in the relevant cone.

Figure 8A:
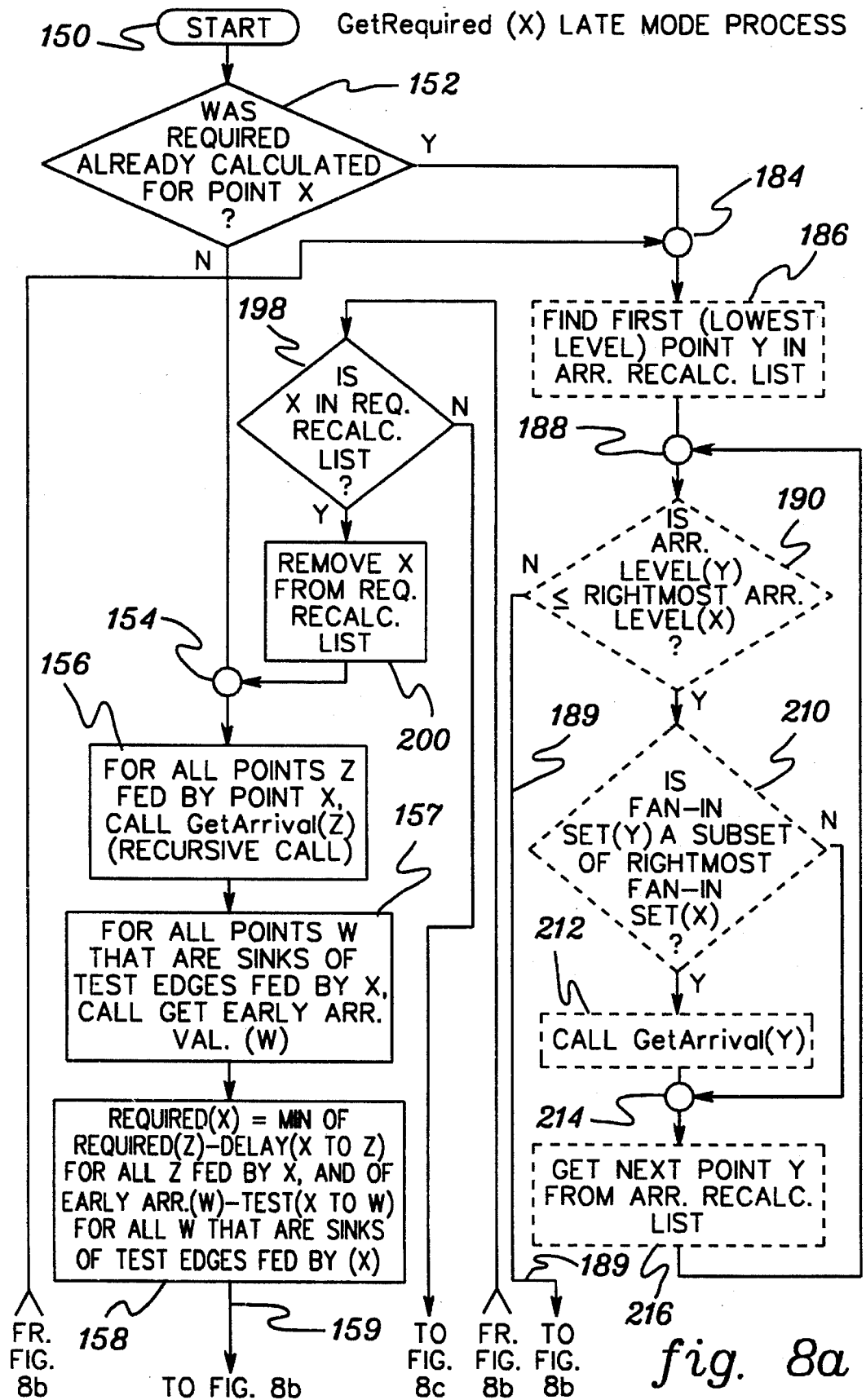
FIGS. 8a, 8b & 8c comprise a flowchart of one embodiment of GetRequired processing employed by the incremental timing analysis process of FIG. 4.
Figure 8B:
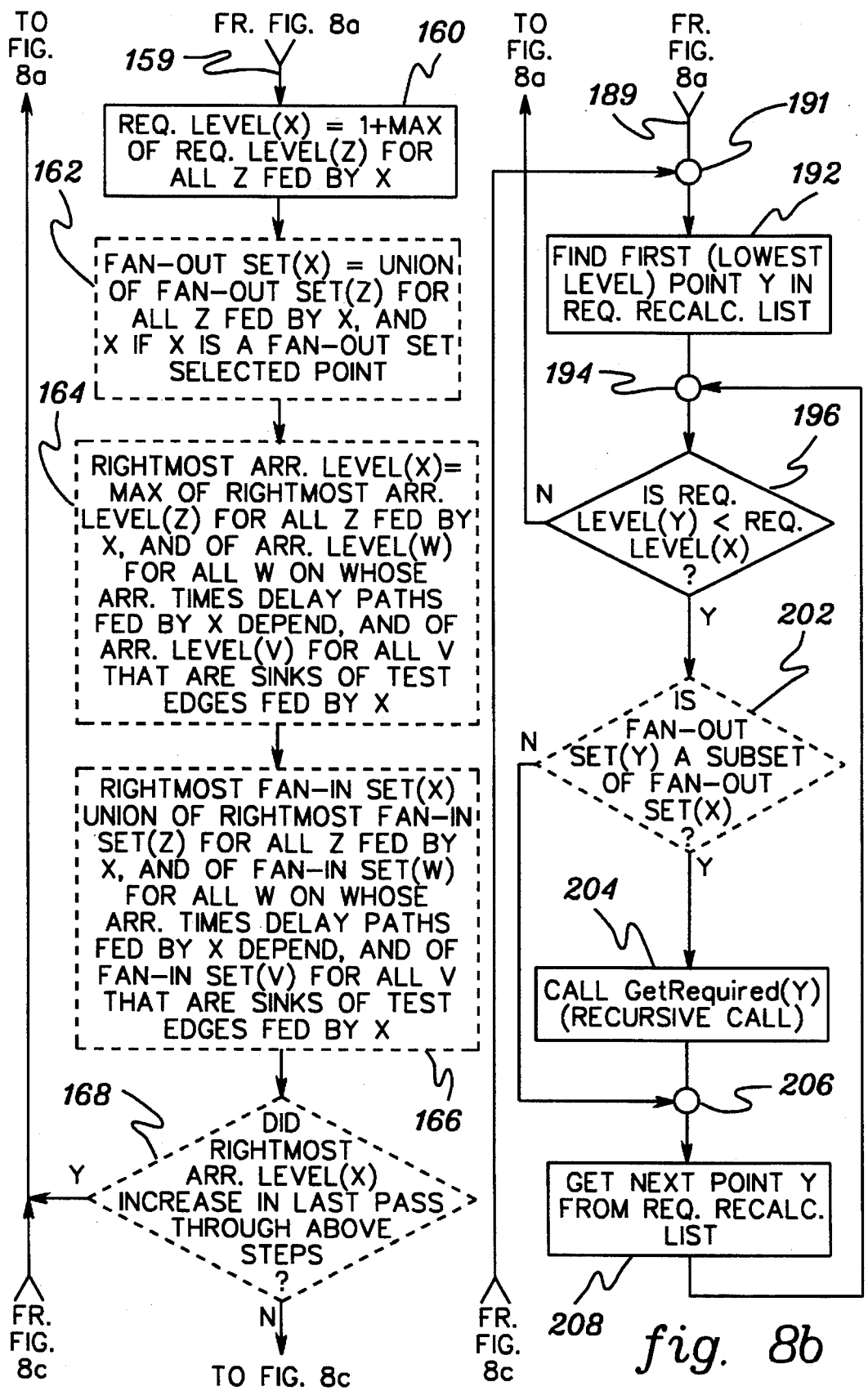
Figure 8C:
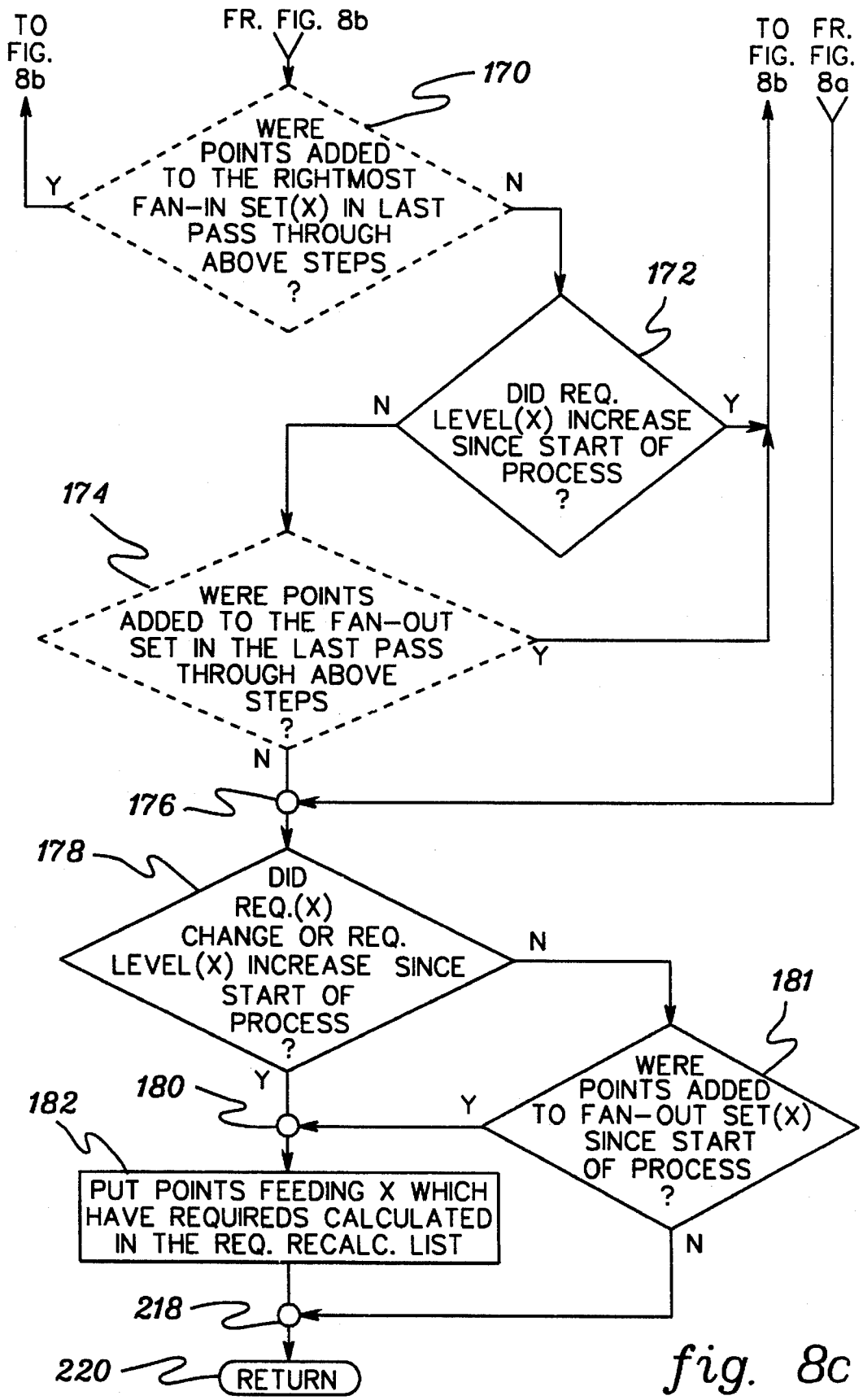

The enhancement is to record (along with each required time) the largest arrival time or forward level number on which the required time depends (referred to in FIGS. 8a–8c as the "rightmost arrival level" of a point). When incremental required time recalculation is done, incremental arrival time recalculation is first completed (as described above) up to and including the maximum arrival time/forward level that the old required time depends on. During this arrival time recalculation, required times dependent on the changing arrival times are queued for recalculation so that after arrival time recalculation, the required times can be recalculated. If during the required time recalculation the maximum arrival time/forward level on which the required time depends increases, then arrival recalculation is continued to that level and required time calculation is done again.

Note that the opposite (forward values dependent on backward values) could be handled in a similar way as long as they are not both dependent on each other, causing a dependency cycle. Because of the causal relationships of propagating signals, there is no physically reasonable situation in which this opposite case occurs.

If such delays are used throughout the model, this would mean that the required times depend on the arrival times at the inputs to the last block(s) before the end of a path. But if we have a mix of different types of blocks, the dependence might not extend as far.

Even when all blocks have these delays (and slews), the required time at a point depends only on the maximum arrival time of the last set of block inputs before the input nodes within its cone of influence. This means recalculation of points toward the ends of deep cones (those with high arrival level numbers could still be avoided) if the required time being queried feeds only a shallower cone. This method guarantees that the recalculated results are always exactly the same as would be obtained doing a non-incremental analysis.

Using fan-in sets, the above-described method which records the largest forward level number on which the required time depends is modified as follows. The enhancement is to record along with each required time the union of the fan-in sets of all points on whose arrival times that required time depends (called the rightmost fan-in set in FIGS. 8a–8c). If the required time depends on an arrival time only because of test paths, the fan-in set of the clock pin of the test path is added to the rightmost fan-in set of the data pin of the test. If it depends on arrival times because of delays dependent on slew propagation, it only depends on them up to the test source of a slew dependent delay path, where that source itself has a path dependent slew.

When incremental required time recalculation is done, an incremental arrival time recalculation is first accomplished for all points that are a subset of the rightmost fan-in set. During this arrival recalculation, required times dependent on the changing arrival times are queued for recalculation. After this arrival time recalculation, the required times are recalculated. If during the rightmost time recalculation the required fan-in set changes such that new points are added, arrival recalculation is repeated, and required time calculation is done again.

Returning to the GetArrival processing flow embodiment of FIG. 7b, and assuming that the logic circuit model contains arrival time dependent required times, the arrival processing flow directs that if point X is the source of any test edge, then its sinks are saved into an early mode required recalculation list, 122 "If X Is The Source Of Any Test Edge, Put Its Sinks In The Early Required Recalc. List," after which the source points of any delayed paths having delays dependent on the arrival time at point X are placed in the required recalculation list, 124 "If Any Delay Paths Have Delays Dependent On Arrival(X), Put Their Sources In The Req. Recalc. List." Processing then proceeds to junction 125.

Returning to inquiry 102 (FIG. 7a) and assuming that arrival times have initially been calculated for the points in the logic circuit model, then processing proceeds via junction 128 to instruction 130 "Find First (Lowest Level) Point Y In Arr. Recalc. List." As noted above, sorting is preferably employed so that the lowest level point Y in the arrival recalculation list should be the first point(s) in the list. After passing through junction 132, a next inquiry determines whether the arrival level of the first arrival queued point in the ATRL is less than the arrival level of the subject point X, 134 "Is Arr. Level(Y)<Arr. Level(X)?" If no points are presently in the arrival queue or if all points Y in the arrival queue are at the same or greater level as the subject point X, then processing is directed to determine whether point X is in the arrival queue, 136 "Is X In Arr. Recalc. List?" Assuming that point X is not already in the arrival queue, then processing proceeds to junction 117 (FIG. 7b, via line 137) and hence to inquiry 118 to determine whether the arrival time at point X changed or the arrival level of point X increased since the start of the present processing. Alternatively, if the subject point X is in the arrival queue then the point is retrieved, 138 "Remove X From Arr. Recalc. List," and processing proceeds via junction 104 to the main processing run of the GetArrival routine beginning at instruction 106.

Assuming that the above described optional enhancement to reduce recalculation times is employed, then a positive answer at inquiry 134 leads the processor to inquire whether the fan-in set(Y) (i.e., the first point in the arrival queue retrieved at instruction 130) is in a subset of the fan-in set of point X, 140 "Is Fan-in Set(Y) A Subset Of Fan-in set(X)?" If "Yes", or if fan-in reduction processing is omitted, then a recursive call is made to GetArrival processing of FIGS. 7a & 7b for point Y, 142 "Call GetArrival(Y) (Recursive Call)." If the fan-in calculation reduction concept is being employed, however, and if the answer to inquiry 140 is "no", then processing circumvents instruction 142 to arrive at junction 144. From junction 144 a next point Y is retrieved from the arrival queue, 146 "Get Next Point Y From Arr. Recalc. List." Thereafter, processing loops back to junction 132 and hence inquiry 134 to determine whether the arrival level of the current point Y is less than the arrival level at the subject point X. Obviously, the particular points (and, therefore, the values) for point X, point Y and point Z change as GetArrival processing proceeds. Because the point is the lowest level point in the ATRL, the recursive call will answer "no" to inquiry 134, terminating the recursion.

Finally, if fan-in reduction processing is employed, then a negative answer at inquiry 118 of the flowchart leads the processor to inquire whether points were added to fan-in set(X), 148 "Were Points Added To Fan-In Set(X) Since Start Of Process?" If "yes", then the processor proceeds (via junction 119) to instruction 120 (discussed above); otherwise, the processing passes to junction 125. From junction 125, recursive processing according to the GetArrival routine is completed and the processor returns to the routine's point of call, 126 "Return".

Figure 9A:
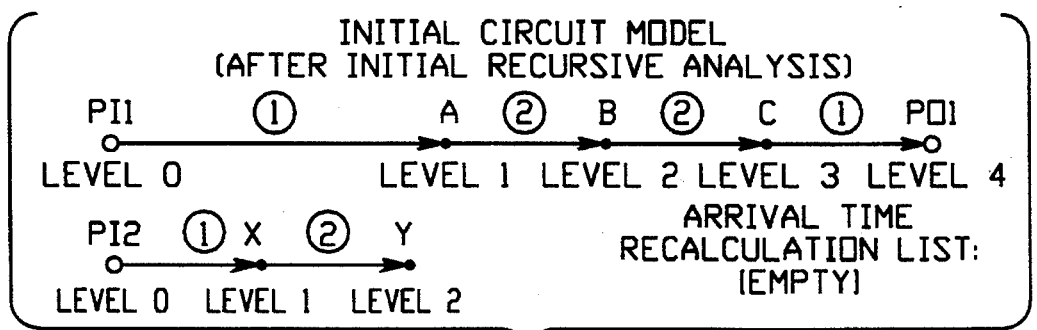
FIG. 9a is a delay graph and ATRL representation of an initial circuit model useful in explaining GetArrival processing pursuant to one embodiment of the present invention.
Figure 9B:
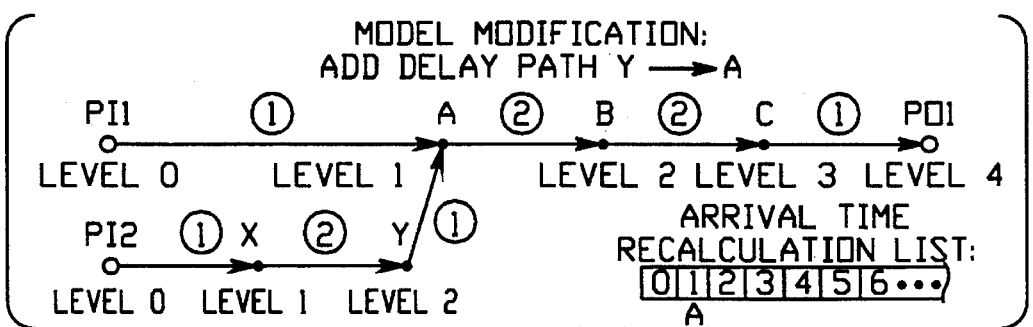
FIG. 9b is a revised delay graph and ATRL in comparison with the delay graph and ATRL of FIG. 9a resulting from a model modification wherein a signal (or delay) path has been added between circuit pts. 'Y' and 'A'.

As noted, FIGS. 9a–9d and 10a–10e present by way of example delay graphs and arrival queue contents of GetArrival processing for two different model modifications. Referring first to FIG. 9a, a delay graph for an initial circuit model is depicted with multiple delay paths between points PI1, A, B, C & PI1 and PI2, X & Y as shown. Initial recursive analysis is assumed to have been completed such that delay times, shown in circles, are associated with each delay path. Levelization is employed with input nodes PI1 & PI2 at level 0, points A & X at level 1, points B & Y at level 2, point C at level 3 and output node PO1 at level 4. The arrival time recalculation list (ATRL) is empty since no modification has been made to the delay graph. A sample model modification is presented in FIG. 9b wherein a delay path is added between points Y and A. The added delay path is further assumed to have an arrival time of "1". Subsequent to the modification, and pursuant to the incremental timing analysis of the present invention, record modification processing of FIG. 5 is conducted such that at inquiry 58 (FIG. 5) the ATRL is loaded with point A at its corresponding level 1.

At some future time, a specific timing query is assumed to be made for the arrival time at point B subsequent to the modification. Pursuant to the overview processing of FIG. 4 this requires the calling of the GetArrival routine of FIGS. 7a & 7b. At the beginning, the subject point X is assumed to be point B and since, as noted, arrival times for all points in the network were initially calculated, then at inquiry 134 it is determined that the arrival level of the only stored point in ATRL (i.e., point A) is less than the arrival level at point B. Therefore, the GetArrival routine is recursively called at instruction 142 for point A.

Beginning GetArrival processing for point A, the processor is again directed to inquiry 134 and hence to inquiry 136 since the only point in ATRL is point A. At inquiry 136 processing determines that point A is in the arrival queue and therefore removes the point from the arrival queue and proceeds to the main processing portion of the GetArrival routine. At instruction 106 a recursive call is made to points PI1 & Y. This third pass at recursive calling for these two points is simply to verify that the arrival times for the subject points are up to date. In each of these calls, processing passes through inquiry 102, inquiry 134, inquiry 136 at which point a negative answer results in flow to junction 117 (FIG. 7b) and hence inquiry 118 wherein a further negative answer completes processing and return is made to the point of call.

Figure 9C:
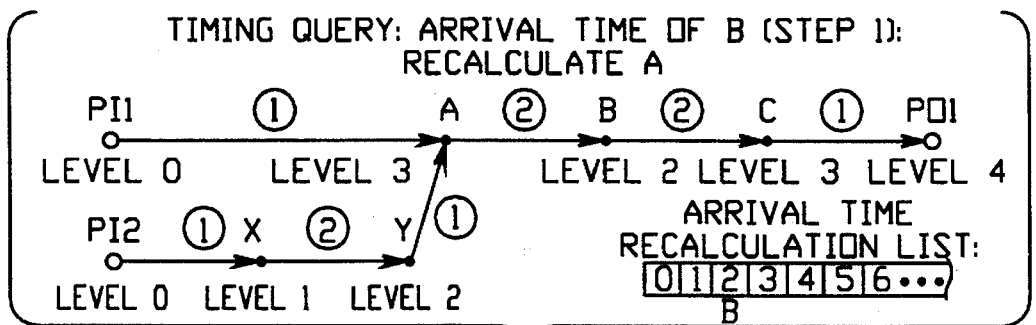
FIG. 9c comprises the delay graph and ATRL of FIG. 9b subsequent to arrival timing recalculation at pt. 'A' pursuant to GetArrival processing of the present invention.

Continuing on with the recursive call for point A, a new arrival time for point A is calculated (instruction 108) along with an arrival level (instruction 110). Thereafter, inquiry is made into whether the arrival level at point A increased at (inquiry 114) and since it did, return is made to junction 128 and hence inquiry 134. This time through the main processing run there will be no change to the arrival time at point A but the arrival level will increase; therefore, the flow from inquiry 114 (FIG. 7b) is to inquiry 118 to determine whether the arrival time changed or the arrival level increased since the start of processing. Since the answer is "yes", instruction 120 directs that point B be placed in the arrival queue at the appropriate assigned level. The result of this processing is depicted in FIG. 9c.

The recursive call for point A is completed and return is made to the point of call (instruction 142) where GetArrival processing for point B continues. Instruction 146 directs that the next point Y (which comprises point B) be obtained from the arrival queue and return is made to inquiry 134, where the answer this time is negative (since the arrival level of B equals the arrival level of B). Thereafter, the arrival time for point B is recalculated in a manner analogous to that for point A. First, point B is removed from the arrival queue, after which processing proceeds down the main flow run starting at instruction 106. Note that upon completion of point B processing, instruction 120 directs point C be placed in the arrival queue. This is because point C is fed by point B and, therefore, it now comprises the frontier processing point left off at in answering the timing query. Point C is placed in the ATRL at level 3, i.e., the originally assigned arrival level to the point. The final delay graph and ATRL are presented in FIG. 9d.

Figure 9D:
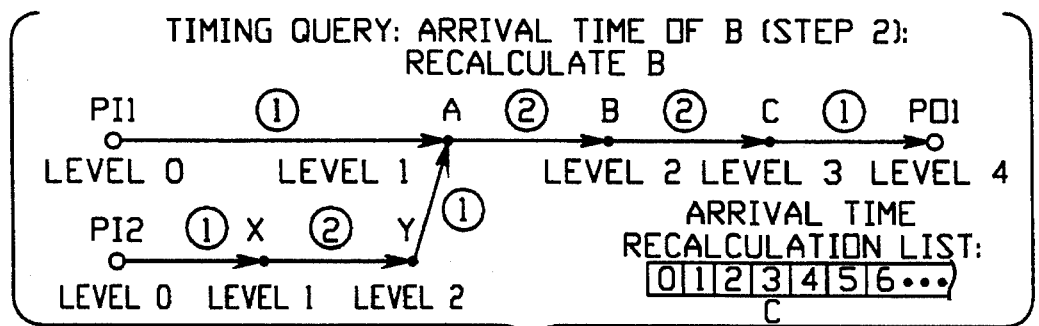
FIG. 9d comprises the delay graph and ATRL of FIG. 9c subsequent to a recalculation of arrival time at pt. 'B' pursuant to GetArrival processing of the present invention.
Figure 10A:
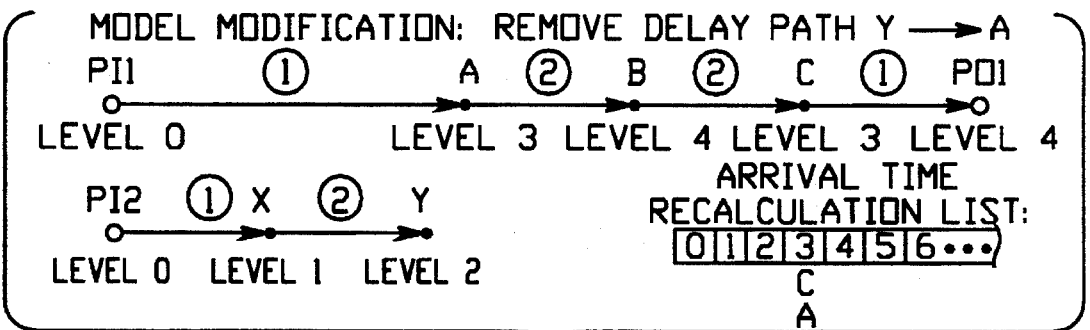
FIG. 10a depicts a delay graph and ATRL for a circuit model modification of the delay path and ATRL of FIG. 9b.

By way of further example, a second model modification is presented to the delay graph and ATRL of FIG. 9d. As shown in FIG. 10a, this modification is to remove the delay path between points Y & A. The modification recording processing of FIG. 5 results in point A being added to the ATRL at level 3. An assumption is then made that a timing query for the arrival time at point C is presented by the application program or user.

Arrival time recalculation for point C is therefore begun employing the GetArrival routine of FIGS. 7a & 7b. From inquiry 134 of FIG. 7a, processing passing through inquiry 136 to remove point C from the ATRL at instruction 138 and hence to recursively call point B (instruction 106), which will in turn recursively call GetArrival(A) via instruction 142, because point A is in the ATRL at level 3 which is less than point B's arrival level of 4.

Figure 10B:
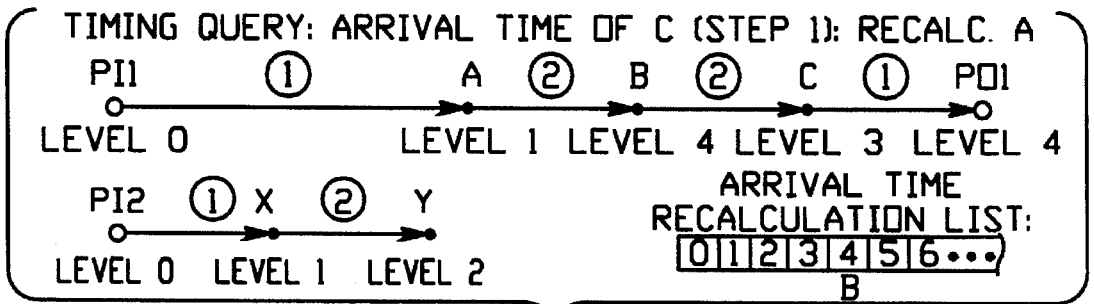
FIG. 10b is the delay graph and ATRL of FIG. 10a subsequent to recalculation of arrival time at pt. 'A' pursuant to GetArrival processing of the present invention.

At inquiry 134, processing (again, the arrival level of point A is not less than the arrival level of point A) passes through the main processing run beginning at instruction 106. Upon arriving at inquiry 118, the processor is directed to instruction 120 since the arrival level of point A is changed from level 3 back to level 1. Instruction 120 then dictates placement of point B in the ATRL at level 4. FIG. 10b presents the delay graph and ATRL subsequent to this step of the processing.

Figure 10C:
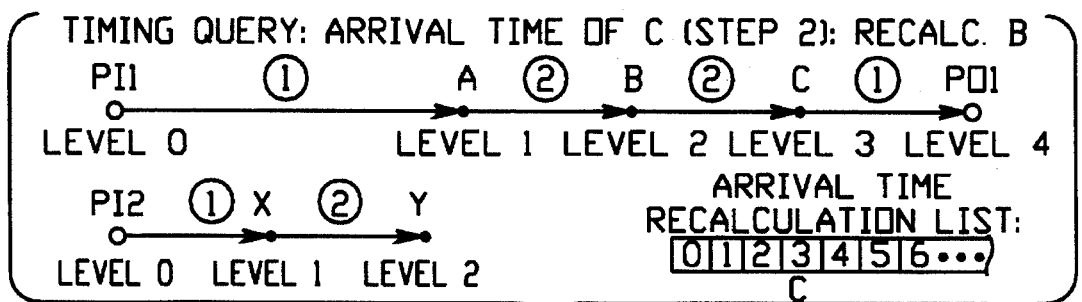
FIG. 10c is the delay graph and ATRL of FIG. 10b subsequent to recalculation of arrival time at pt. 'B' pursuant to GetArrival processing of the present invention.

On returning from the recursive call for point A, inquiry 134 receives the answer "no", and inquiry 136 receives the answer "yes", since point B is on the ATRL. This recursive call is a simple case with a new level number "2" being assigned and a new arrival time, which ultimately results in point C being placed in the ATRL at its presently assigned level number. FIG. 10c depicts the delay graph and ATRL subsequent to recalculation of arrival time at point B.

Figure 10D:
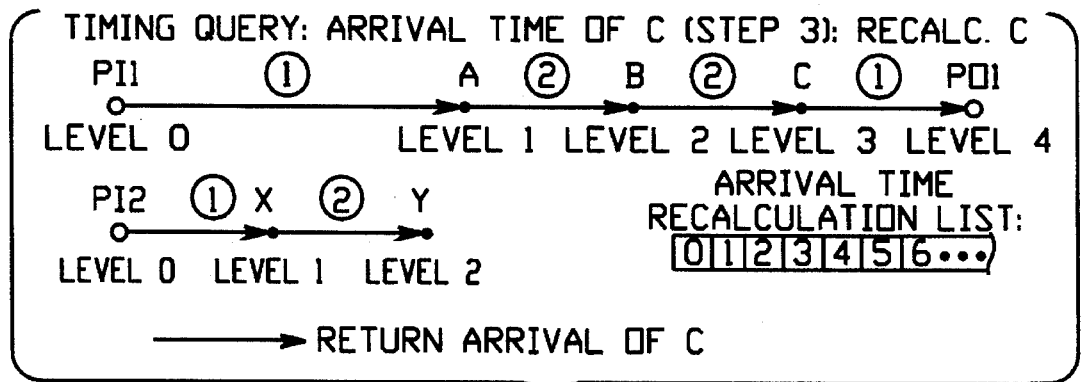
FIG. 10d is the delay graph and ATRL of FIG. 10c subsequent to final recalculation of arrival time at pt. 'C' pursuant to GetArrival processing of the present invention.

Finally, return is made to the original recursive call to determine the updated arrival time at point C. Flow continues to instruction 108 and an updated arrival time and arrival level are determined. Because there has been no net change in the delay graph since the last (initial) calculation of the arrival time at point C, the arrival time, arrival level, and fan-in set of point C will be unchanged, and the routine defaults to inquiry 118 and hence inquiry 148. From inquiry 148 processing returns to point of call via junction 125, since no points have been added to the fan-in set of point C, and the updated arrival time for point C is provided. FIG. 10d depicts the delay graph and ATRL subsequent to completion of this GetArrival routine processing.

As noted above, FIGS. 8a–8c depict one embodiment of a GetRequired (late mode) process pursuant to the present invention. In terms of processing flow, this routine is very similar to the GetArrival process presented in FIGS. 7a & 7b. A complication arises, however, when optional fan-in and fan-out cone reduction processing is employed along with the capability to handle test edge examination cases. (Again, in "test edge" cases, required time is often dependent upon arrival time.) A discussion of FIGS. 8a–8c is next presented.

GetRequired processing begins, 150 "Start," with a determination of whether a required time has already been calculated for point X, 152 "Was Required Already Calculated For Point X?" If "no", then processing passes (through junction 154) to a main flow process where the immediate fan-out of point X is determined, 156 "For All Points Z Fed By Point X, Call GetArrival(Z) (Recursive Call)," and 157 "For All Points W That Are Sinks Of Test Edges Fed By X, Call Get Early Arr. Val.(W)." Thereafter, the required time at point X is determined as a function of the required time of points fed by point X and arrival time of points on the other sides of test edges, 158 "Required(X)=Min Of Required(Z)—Delay(X to Z) For All Z Fed By X, And Of Early Arr.(W)—Test(X to W) For All W That Are Sinks Of Test Edges Fed By (X)." From instruction 158, flow proceeds (via line 159) to instruction 160 (FIG. 8b) where an updated required level is determined, 160 "Req. At Level(X)=1+Max Of Req. Level(Z) For All Z Fed By X." (As in the previous flowchart, optional processes are depicted in phantom.)

Instructions 162, 164 & 166, along with inquiries 168 & 170, relate to the use of fan-out sets in combination with test edge scenarios within the logic model design. Instruction 162 "Fan-Out Set(X)=Union Of Fan-Out Set(Z) For All Z Fed By X, And X If X Is A Fan-Out Set Selected Point," updates the fan-out set for point X, while the maximum arrival level and fan-in set of any point whose arrival time could affect the required time of point X are updated, 164 "Rightmost Arr. Level(X)=Max Of Rightmost Arr. Level(Z) For All Z Fed By X, And Of Arr. Level(W) For All W On Whose Arrival Times Delay Paths Fed By X Depend, And Of Arr. Level(V) For All V That Are Sinks Of Test Edges Fed By X," and 166 "Rightmost Fan-In Set(X)=Union Of Rightmost Fan-In Set(Z) For A Z Fed By X, And Of Fan-In Set(W) For All W On Whose Arrival Times Delay Paths Fed By X Depend, And Of Fan-In Set(V) For All V That Are Sinks Of Test Edges Fed By X," respectively. From instruction 166 two inquiries are serially presented to determine whether arrival times may need to be recalculated, 168 "Did Rightmost Arr. Level(X) Increase In Last Pass Through Above Steps?" and 170 (FIG. 8c) "Were Points Added To The Rightmost Fan-In Set(X) In Last Pass Through Above Steps," respectively.

Continuing with FIG. 8c, inquiry is made into whether the required level of point X increased in the last pass through the main processing run, 172 "Did Req. Level X Increase In Last Pass Through Above Steps?" If "yes", then the processing is directed back to junction 191 (FIG. 8b) for further consideration of the required time. Assuming that fan-out cone processing reduction is employed, then the processor inquires whether points have been added to the fan-out set during the recent processing, 174 "Were Points Added To The Fan-Out Set In The Last Pass Through Above Steps?" If "yes", return is made to junction 191 (FIG. 8b), while if "no" (or if this processing option is not employed), inquiry is made into whether the required time at point X changed or the required level at point X increased since the start of processing, 178 "Did Req.(X) Or Req. Level(X) Increase Since Start Of Process?" If "no", then a similar inquiry is made to determine whether points were added to the fan-out set for point X since the start of processing, 181 "Were Points Added To Fan-Out Set(X) Since Start Of Process?" Again if "no", processing flow is to junction 218, while if "yes" (or if the answer to inquiry 178 is "yes") then processing updates the frontier of change in the required time recalculation list, 182 "Put Points Feeding X Which Have Requireds Calculated In The Req. Recalc. List."

Returning to inquiry 152 of FIG. 8a, and assuming that required times have already been calculated for the points of the subject circuit model, then flow is (through junction 184) to a first subprocess comprising instructions 186, 212 & 216 and inquiries 190 & 210. This subprocessing retrieves and examines arrival times that affect the required time at point X. As noted by the phantom lines, the processing is optional, and is dependent upon whether the circuit model includes test edges. In the event that this option is not employed, processing proceeds from junction 184 directly to junction 191 via line 189.

The lowest level point Y is retrieved from the arrival recalculation list, 186 "Find First (Lowest Level) Point Y In Arr. Recalc. List," and inquiry is made into whether the arrival level of point Y is less than or equal to the rightmost arrival level point X, 190 "Is Arr. Level(Y)≦Rightmost Arr. Level(X)?" Again, this inquiry seeks to determine whether the arrival time at point Y could affect the required time at point X. If "no", processing drops via line 189 to FIG. 8b (and hence junction 191). Conversely, the arrival time at point Y could affect the required time at point X, then inquiry is made into whether the fan-in set of point Y is a subset of the rightmost fan-in set of point X, 210 "Is Fan-In Set(Y) A Subset Of Rightmost Fan-In Set(X)?" If "yes", then GetArrival routine processing is called for point Y to update point Y, 212 "Call GetArrival(Y);" otherwise processing drops to junction 214 and hence instruction 216 to retrieve a next point Y from the arrival recalculation list, 216 "Get Next Point Y From Arr. Recalc. List."

Referring to FIG. 8b, processing proceeds via junction 191 to instruction 192 where another subprocess routine (consisting of instructions 192, 204 & 208 and inquiries 196 & 202) is assembled to determine whether any points to the right of a point in question could affect the required time at that point. First, the lowest level point is retrieved from the required time recalculation list, 192 "Find First (Lowest Level) Point Y In Req. Recalc. List." A determination is then made whether the required level at point Y is less than the required level of point X, 196 "Is Req. Level(Y)<Req. Level(X)?" If "no", then the required time at point Y can affect the required time at point X and its time and level need to be updated.

In such a case, processing returns to FIG. 8a and hence inquiry 198 "Is X In Req. Recalc. List?" Assuming that point X is in the RTRL then the point is removed, 200 "Remove X From Req. Recalc. List," and processing drops to the main update flow of the GetRequired routine beginning at instruction 146 (described above). If the required level of point Y is less than the required level of point X, then (in the optional embodiment) inquiry is made into whether the fan-out set of Y is a subset of the fan-out set of X, 202 "Is Fan-out Set(Y) A Subset Of Fan-Out Set(X)?" If "yes", then the required time for point Y needs to be updated, 204 "Call GetRequired(Y) (Recursive Call)." Otherwise, flow circumvents instruction 204 and passes to instruction 208 where a next point Y is retrieved from the RTRL, 208 "Get Next Point Y From Req. Recalc. List." Once all points which could affect the required time at point X have been considered, processing drops through the main routine portion of GetRequired(X) to junction 218. From junction 218, return is made to the point of call., 220 "Return."

While the invention has been described in detail herein in terms of timing analysis, the same processes may be used for the incremental calculation of any set of values which are computed on a directed acyclic graph, such that the "forward propagated values" at a point are dependent only on the forward propagated values at the points feeding it and on the characteristics of the edges feeding it, and such that the "backward propagated values" at a point are dependent only on the backward propagated values at the points fed by it and on the characteristics of the edges fed by it. If the optional handling of required times based on arrival times is employed, the backward propagated values may also depend on some of the forward propagated values.

An example of this is the transduction method of logic synthesis, which is discussed in the open literature. In it, the logical function (LF) of each gate in a logic network is computed in a forward propagated manner, and the MSPF (maximum set of permissible functions) or CSPF (compatible set of permissible functions) is computed in a backward propagated manner. The computation of the MSPF or CSPF of a gate also requires the LF of that gate.

The process of this invention could be used in transduction by computing LFs instead of arrival times, and computing MSPF's or CSPFs instead of required times. Similar changes in nomenclature would be made to the arrival, required, and rightmost required levels, and to the arrival and required recalculation list, although the use of these levels and lists would be identical to that in timing analysis presented herein.

The methods/analyzer systems presented herein each employ a novel technique for selectively performing timing analysis in an incremental manner on a modified electronic circuit design resulting from one or more modifications to a given electronic circuit layout. With each modification to the given electronic circuit layout data is recorded in a arrival time recalculation list and a required time recalculation list such that frontiers of change in relative time values for those nodes affected by a given modification are assembled. These frontiers of change then allow a deferral in the recalculation of relative time values until specifically requested by an application program or user.

Additionally, once a request for an updated timing value is presented, the cumulative frontiers of change in relative timing values are employed to limit timing value recalculation to only those nodes necessary to answer the specific query. Preferably, the frontiers of change are in a sorted order within their respective recalculation lists to limit unnecessary repeated computation of a timing value at any given point. Further reduction in the recalculation process may be obtained by employing fan-in sets and fan-out sets in combination with the technique disclosed. Also, described herein is an approach to handling required times which depend on arrival times.

Finally, the concepts presented may be used for incremental recalculation of any signal value propagated forward or backward through a logic network (or any other directed acyclic graph) such that the value at a point in the graph depends only the values on the points feeding (fed by) it. Examples include incremental update of simulation values, controllability and observability information used in test generation, controllability information used in logic synthesis, etc.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A method for selectively performing timing analysis of a modified electronic circuit design resulting from a modification to an initial electronic circuit design having input nodes, output nodes, and active elements electrically connected therebetween in a set of signal paths interconnected by a plurality of nodes, each signal path having a timing delay associated therewith, said method comprising the steps of:

(a) providing an automated circuit timing analyzer that accepts data representing time values of a set of signals applied to said input nodes and determines relative time values at each of said plurality of nodes for said signals propagated through the initial electronic circuit design;

(b) recording data representative of said modification to the initial electronic circuit design, said modification affecting relative time values for at least one of said signals propagated through the initial electronic circuit design, said recording including determining and storing a leftmost frontier of change in said relative time values resulting from said modification to said initial electronic circuit design and a rightmost frontier of change in said relative time values resulting from said modification to said initial electronic circuit design;

(c) subsequent to said step (b), receiving a request for timing analysis of a selected portion of the modified electronic circuit design; and (d) conducting timing value analysis of said selected portion of the modified electronic circuit design including determining a relative timing value for at least one of said propagated signals at a node in the modified electronic circuit design utilizing at least one of said stored leftmost and rightmost frontiers of change in said relative time values to limit said timing value analysis.

2. The method of claim 1, wherein in said recording step (b) said leftmost frontier of change comprises an arrival time frontier and said rightmost frontier of change comprises a required time frontier, said arrival and required time frontiers being indicative of the extent of change in said relative time values at said plurality of nodes for said propagated set of signals resultant from said incremental modification to said initial electronic circuit design.

3. The method of claim 2, wherein said at least one node of said conducting and determining step (d) is located in the modified electronic circuit design within a set of nodes defined by at least one of said arrival time frontier and said required time frontier.

4. The method of claim 2, further comprising the step of providing memory space for an arrival time recalculation list and a required time recalculation list, said recording step (b) including recording said arrival time frontier in said arrival time recalculation list and said required time frontier in said required time recalculation list.

5. The method of claim 4, further comprising the step of sorting relative time values within said arrival time recalculation list and sorting relative timing values within said required time recalculation list such that recalculation of relative timing values needed to complete said timing value analysis request in said conducting and determining step (d) is minimized.

6. The method of claim 4, wherein said recording step (b) further comprises the step of determining which signal path of said set of signal paths is added, deleted or has its associated timing delay changed due to said incremental modification to the initial electronic circuit design.

7. The method of claim 6, wherein for each such determined signal path of said set of signal paths, said recording step (b) further comprises identifying the signal path's source and storing data representing the signal path's source in said required time recalculation list, and identifying the signal path's sink and storing data representing the signal path's sink in said arrival time recalculation list.

8. The method of claim 1, wherein said determining step (d) includes employing said automated circuit timing analyzer provided in said step (a) to propagate updated relative timing values for at least some nodes in said selected portion of the modified electronic circuit design having changed timing values due to said incremental modification to said initial electronic circuit design.

9. The method of claim 1, wherein said providing step (a) includes providing a circuit timing analyzer employing recursive analysis.

10. The method of claim 1, wherein said providing step (a) includes providing a circuit timing analyzer employing levelization.

11. The method of claim 1, wherein a plurality of incremental modifications are sequentially made to said initial electronic circuit design, and wherein said recording step (b) includes recording each of said plurality of incremental modifications to the initial electronic circuit design such that cumulative leftmost and rightmost frontiers of change in said relative time values resulting from said plurality of incremental modifications are determined and stored.

12. The method of claim 1, wherein said conducting and determining step (d) proceeds until a predetermined condition is satisfied.

13. The method of claim 12, wherein said predetermined condition comprises obtaining an unchanged relative timing value during said step (d).

14. The method of claim 12, wherein said predetermined condition comprises ascertaining that said at least one node has no previously calculated relative timing value.

15. The method of claim 1, wherein said conducting and determining step (d) includes employing fan-in set and fan-out set calculation to improve efficiency of said timing value analysis.

16. The method of claim 1, wherein said modified electronic circuit design includes required relative time values which are dependent on arrival relative time values.

17. A method for delayed incremental analysis of a propagated signal value within a modified version of a given circuit having a plurality of nodes, said method comprising the steps of:

(a) propagating said signal value within said given circuit and storing based thereon relative signal values for at least some nodes of said plurality of nodes;

(b) modifying said given circuit to produce said modified version thereof;

(c) recording data representative of a leftmost frontier of change in relative signal values and a rightmost frontier of change in relative signal values resulting from said modification of said step (b);

(d) subsequent to said step (c), receiving a request for an updated relative signal value at one of said at least some nodes having said relative signal values stored in said step (a); and (e) responsive to said step (d), employing said data recorded in said step (c) to determine said updated relative signal value without requiring complete propagation of said signal value within the modified version of the given integrated circuit layout.

18. The method of claim 17, further comprising the step of providing memory space containing a forward recalculation list and a backward recalculation list, and wherein said recording step (c) further includes recording said leftmost frontier of change in relative signal values in said forward recalculation list and recording said rightmost frontier of change in said relative signal values in said backward recalculation list.

19. The method of claim 18, wherein said propagating step (a) utilizes a conventional propagated signal circuit analyzer.

20. The method of claim 19, wherein said conventional propagated signal circuit analyzer employs recursive signal propagation circuit analysis.

21. The method of claim 17, wherein multiple modifications are made to said given integrated circuit layout by repeating said modifying step (b), said recording step (c) including recording for each of said multiple modifications a leftmost frontier of change in relative signal values and a rightmost frontier of change in relative signal values such that cumulative leftmost and rightmost frontiers of change in said relative signal values resulting from said multiple modifications are determined and stored.

22. The method of claim 17, wherein said propagated signal value comprises a propagated timing signal value and said method determines an updated timing signal value at said one node.

23. A method for selectively performing timing analysis of a modified electronic circuit design resulting from an incremental modification to an initial electronic circuit design having input nodes, output nodes, and active elements electrically connected therebetween in a set of signal paths interconnected by a plurality of nodes, each signal path having a timing delay associated therewith, said incremental modification affecting relative time values for at least some of a set of signals propagated through the initial electronic circuit design, said method comprising the steps of:

(a) recording data representative of the frontiers of change in relative timing values effected by said incremental modification to the initial electronic circuit design;

(b) subsequent to said step (a), receiving a request for an updated incremental timing analysis of the modified electronic circuit design, said request requiring timing analysis of at least one node having its relative timing value changed by said incremental modification to said initial electronic circuit design; and (c) responsive to said step (b), retrieving at least some of said frontiers of change data recorded in said step (a) and conducting said requested, updated incremental timing analysis, including calculating an updated relative timing value for said at least one node having its relative timing value changed by said incremental modification.

24. The method of claim 23, wherein in said recording step (a) a leftmost frontier of change comprising an arrival time frontier is recorded and a rightmost frontier of change comprising a required time frontier is recorded, said arrival time frontier being recorded in memory space comprising an arrival time recalculation list and said required time frontier being recorded in memory space comprising a required time recalculation list.

25. The method of claim 24, further comprising the step of modifying said frontiers of change in relative timing values pursuant to said updating of incremental timing analysis in said step (c) such that said frontiers of change in relative timing values define a range of nodes within said plurality of nodes still requiring updating of relative timing values as a result of said incremental modification to the initial electronic circuit design.

26. The method of claim 23, wherein a plurality of incremental modifications are made to said initial electronic circuit design, and wherein said recording step (a) includes recording a frontier of change in relative timing values resulting from each of said incremental modifications to the initial electronic circuit design such that a cumulative leftmost frontier of change in relative timing values and a cumulative rightmost frontier of change in relative timing values result from said plurality of incremental modifications.

27. The method of claim 26, wherein said recording step (a) includes sorting said data representative of the frontiers in change in relative timing values such that recalculation of relative timing values needed to calculate said updated relative timing value in said step (c) is minimized.

28. An incremental timing analyzer for performing selective timing analysis upon a modified electronic circuit design resulting from a modification to an initial electronic circuit design having input nodes, output nodes, and active elements electrically connected therebetween in a set of signal paths interconnected by a plurality of nodes, each signal path having a timing delay associated therewith, said incremental timing analyzer comprising:

an automated non-incremental circuit timing analyzer that accepts data representing time values of a set of signals applied to said input nodes and determines relative timing values at each of said plurality of nodes for said signals propagated through the initial electronic circuit design;

memory means for recording data representative of a leftmost frontier of change in said relative timing values resulting from said modification to said initial electronic circuit design and a rightmost frontier of change in said relative timing values resulting from said modification to said initial electronic circuit design; and incremental means for determining a timing value for a propagated signal at a selected node in the modified electronic circuit design utilizing said automated non-incremental circuit timing analyzer and at least one of said recorded leftmost and rightmost frontiers of change in said relative timing values to limit said timing value analysis to updating only those nodes needed to determine said timing value at said selected node.

29. The incremental timing analyzer of claim 28, wherein said leftmost frontier of change recorded in said memory means comprises an arrival time frontier and said rightmost frontier of change recorded in said memory means comprises a required time frontier.

30. The incremental timing analyzer of claim 28, wherein said automated non-incremental circuit timing analyzer employs at least one of recursive analysis and levelization.

31. The incremental timing analyzer of claim 28, wherein multiple modifications are made to said initial electronic circuit design, and wherein said memory means records data representative of a cumulative leftmost frontier of change in said relative timing values resulting from said multiple modifications and a cumulative rightmost frontier of change in said relative timing values resulting from said multiple modifications.

32. The incremental timing analyzer of claim 28, further comprising means for updating said leftmost frontier of change in said relative timing values and said rightmost frontier of change in said relative timing values recorded in said memory means such that said frontiers of change define a range of nodes having timing values yet to be updated as a result of said modification to the initial electronic circuit design.

* * * * *